(12) United States Patent
Park

(10) Patent No.: US 12,341,131 B2
(45) Date of Patent: Jun. 24, 2025

(54) SEMICONDUCTOR PACKAGE

(71) Applicant: Samsung Electronics Co., Ltd., Suwon-si (KR)

(72) Inventor: Hyunmog Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 644 days.

(21) Appl. No.: 17/739,618

(22) Filed: May 9, 2022

(65) Prior Publication Data

US 2023/0107845 A1 Apr. 6, 2023

(30) Foreign Application Priority Data

Oct. 5, 2021 (KR) ........................ 10-2021-0131972

(51) Int. Cl.
| | | |
|---|---|---|
| *H01L 25/065* | (2023.01) | |
| *H01L 25/00* | (2006.01) | |
| *H01L 25/16* | (2023.01) | |
| *H01L 25/18* | (2023.01) | |

(52) U.S. Cl.
CPC .......... *H01L 25/0657* (2013.01); *H01L 25/18* (2013.01); *H01L 25/50* (2013.01); *H01L 25/16* (2013.01); *H01L 2225/06506* (2013.01); *H01L 2225/0651* (2013.01); *H01L 2225/06524* (2013.01); *H01L 2225/06562* (2013.01)

(58) Field of Classification Search
CPC ..... H01L 25/0657; H01L 25/16; H01L 25/18; H01L 2225/06506; H01L 2225/0651; H01L 2225/06562; H01L 2224/32145–32148; H01L 2224/49105–49109
See application file for complete search history.

(56) References Cited

U.S. PATENT DOCUMENTS

| | | | |
|---|---|---|---|
| 9,229,887 | B2 | 1/2016 | Jeddeloh |
| 9,263,105 | B2 | 2/2016 | Jeon et al. |
| 10,971,499 | B2 * | 4/2021 | Lu .......................... H10B 12/36 |
| 10,978,427 | B2 | 4/2021 | Li et al. |
| 2014/0376295 | A1 | 12/2014 | Oh et al. |
| 2020/0286860 | A1 * | 9/2020 | Lee ......................... H01L 24/80 |
| 2021/0082865 | A1 | 3/2021 | Baraskar et al. |
| 2021/0090612 | A1 | 3/2021 | Park et al. |

* cited by examiner

*Primary Examiner* — Daniel P Shook
(74) *Attorney, Agent, or Firm* — Harness, Dickey & Pierce, P.L.C.

(57) ABSTRACT

A semiconductor package includes: a semiconductor structure including: a first bonding semiconductor chip; a second bonding semiconductor chip on the first bonding semiconductor chip, the second bonding semiconductor chip having a cross-section area in a horizontal direction less than a cross-section area of the first bonding semiconductor chip in the horizontal direction; a chip connection pad between the first bonding semiconductor chip and the second bonding semiconductor chip; and a wire bonding pad on the first bonding semiconductor chip to be outside of the second bonding semiconductor chip; a first stacked semiconductor chip on the semiconductor structure and including a first chip pad on an upper surface thereof; and a second stacked semiconductor chip on the first stacked semiconductor chip to expose the first chip pad and including a second chip pad on an upper surface thereof.

20 Claims, 19 Drawing Sheets

SEMICONDUCTOR PACKAGE

CROSS-REFERENCE TO RELATED APPLICATION

This application is based on and claims priority under 35 U.S.C. § 119 to Korean Patent Application No. 10-2021-0131972, filed on Oct. 5, 2021 in the Korean Intellectual Property Office, the disclosure of which is incorporated by reference herein in its entirety.

BACKGROUND

The inventive concepts relate to a semiconductor package.

It is required that a storage capacity of a semiconductor chip increases and at the same time, a semiconductor package including the semiconductor chip is thin and light. In addition, there is a trend that research into including semiconductor chips having various functions in a semiconductor package, and research into driving the semiconductor chips faster are conducted. In response to this trend, research into reducing a size of the semiconductor package, and research into improving operation performance of the semiconductor package are actively conducted.

SUMMARY

The inventive concepts provide a thin and light semiconductor package.

In addition, the inventive concepts provide a semiconductor package capable of rapidly detecting and correcting an error of data.

In addition, the inventive concepts provide a semiconductor package, in which data processing performance is improved, and power required for data processing is reduced.

According to an aspect of the inventive concepts, there is provided a semiconductor package including: a semiconductor structure including: a first bonding semiconductor chip including a first active layer in an upper portion thereof; a second bonding semiconductor chip on the first bonding semiconductor chip, the second bonding semiconductor chip including a second active layer in a lower portion thereof to face the first active layer and having a cross-section area in a horizontal direction less than a cross-section area of the first bonding semiconductor chip in the horizontal direction; a chip connection pad between the first bonding semiconductor chip and the second bonding semiconductor chip; and a wire bonding pad on the first bonding semiconductor chip to be outside the second bonding semiconductor chip; a first stacked semiconductor chip on the semiconductor structure and including a first chip pad on an upper surface thereof; a second stacked semiconductor chip on the first stacked semiconductor chip to expose the first chip pad and including a second chip pad on an upper surface thereof; and a bonding wire configured to connect at least one of the wire bonding pad to the first chip pad, the wire bonding pad to the second chip pad, or the first chip pad to the second chip pad.

According to another aspect of the inventive concepts, there is provided a semiconductor package including: a semiconductor structure including: a first bonding semiconductor chip including a first active layer in an upper portion thereof; a second bonding semiconductor chip on the first bonding semiconductor chip, the second bonding semiconductor chip including a second active layer in a lower portion thereof to face the first active layer and having a cross-section area in a horizontal direction identical to a cross-section area of the first bonding semiconductor chip in the horizontal direction; a plurality of chip connection pads between the first bonding semiconductor chip and the second bonding semiconductor chip; a wire bonding pad on the second bonding semiconductor chip; and an upper penetration electrode configured to penetrate at least a portion of the second bonding semiconductor chip in a vertical direction to connect at least any one of the plurality of chip connection pads to the wire bonding pad; a first stacked semiconductor chip on the semiconductor structure and including a first chip pad on an upper surface thereof; a second stacked semiconductor chip on the first stacked semiconductor chip to expose the first chip pad and including a second chip pad on an upper surface thereof; and a bonding wire configured to connect the wire bonding pad to the first chip pad, connect the wire bonding pad to the second chip pad, or connect the first chip pad to the second chip pad.

According to another aspect of the inventive concepts, there is provided a semiconductor package including: a semiconductor structure including: a first bonding semiconductor chip including a first active layer in an upper portion thereof; a second bonding semiconductor chip on the first bonding semiconductor chip, the second bonding semiconductor chip including a second active layer in a lower portion thereof to face the first active layer and having a cross-section area in a horizontal direction less than a cross-section area of the first bonding semiconductor chip in the horizontal direction; a chip connection pad between the first bonding semiconductor chip and the second bonding semiconductor chip; a wire bonding pad on the first bonding semiconductor chip to be outside of the second bonding semiconductor chip; and a lower penetration electrode configured to penetrate at least a portion of the first bonding semiconductor chip in a vertical direction and connected to the chip connection pad;

a redistribution structure arranged under the semiconductor structure, the redistribution structure including: a redistribution insulation layer that supports the semiconductor structure; and a redistribution pattern that extends in the redistribution insulation layer and connected to the lower penetration electrode; a first stacked semiconductor chip on the semiconductor structure and including a first chip pad on an upper surface thereof; a second stacked semiconductor chip on the first stacked semiconductor chip to expose the first chip pad and including a second chip pad on an upper surface thereof; and a bonding wire configured to connect at least one of the wire bonding pad to the first chip pad, the wire bonding pad to the second chip pad, or the first chip pad to the second chip pad.

A semiconductor package according to an example embodiment includes a semiconductor structure formed by bonding a first bonding semiconductor chip with a second bonding semiconductor chip. In addition, the first bonding semiconductor chip of the semiconductor structure includes an error correction code (ECC) circuit and a frequency boosting interface (FBI) circuit therein. Accordingly, the semiconductor package including the semiconductor structure does not include separate semiconductor chips for the ECC circuit and the FBI circuit, and thus the semiconductor package may be thin and light.

In addition, because the first bonding semiconductor chip of the semiconductor package according to an example embodiment includes the ECC circuit therein, detection and correction of data errors of a plurality of stacked semiconductor chips on the semiconductor structure may be promptly performed.

In addition, because the first bonding semiconductor chip of the semiconductor package according to an example embodiment includes the ECC circuit therein, the data processing performance of the plurality of stacked semiconductor chips on the semiconductor structure may be improved.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Hereinafter, embodiments of the inventive concepts will be described in detail with reference to the accompanying drawings.

Figure 1:
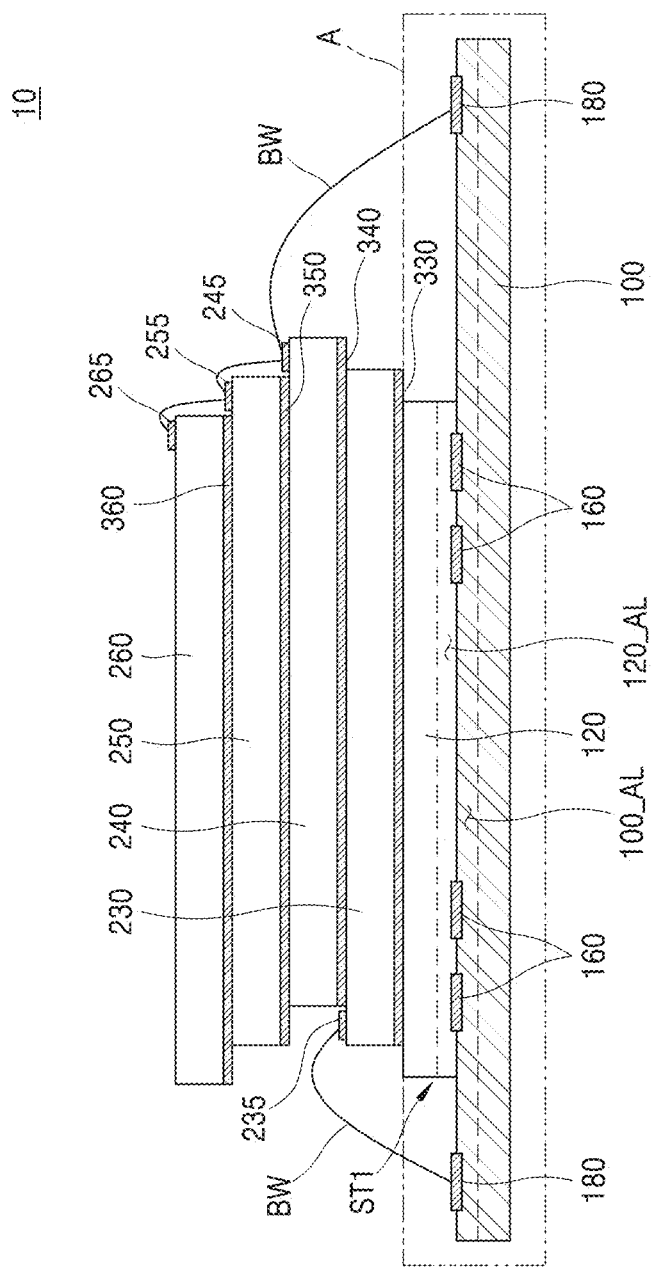
FIG. 1 is a cross-sectional view of a semiconductor package according to an example embodiment.

FIG. 1 is a cross-sectional view of a semiconductor package 10 according to an example embodiment.

Referring to FIG. 1, the semiconductor package 10 according to an example embodiment may include a first semiconductor structure ST1, first through fourth stacked semiconductor chips 230, 240, 250, and 260, adhesion layers 330, 340, 350, and 360, and a bonding wire BW. In addition, the first semiconductor structure ST1 may include a first bonding semiconductor chip 100, a second bonding semiconductor chip 120, a chip connection pad 160, a wire bonding pad 180, etc.

The first semiconductor structure ST1 may include a structure in which the first semiconductor chip 100 is bonded with the second bonding semiconductor chip 120. In an example embodiment, the first semiconductor structure ST1 may be formed by using a die-to-wafer bonding process. For example, the first bonding semiconductor chip 100 may be provided at a wafer level, and the second bonding semiconductor chip 120 may be provided at a die level. After the second bonding semiconductor chip 120 at the die level is bonded with the first bonding semiconductor chip 100 at the wafer level, an individualization process of a bonding structure may be performed. Accordingly, the first semiconductor structure ST1 of the inventive concepts may be formed.

Hereinafter, a horizontal direction may be defined as a direction in parallel with a direction in which an upper surface and a lower surface of the first bonding semiconductor chip 100 extend, and a vertical direction may be defined as a direction vertical to a direction in which the upper surface and the lower surface of the first bonding semiconductor chip 100 extend.

The first bonding semiconductor chip 100 may include a semiconductor chip arranged under the second bonding semiconductor chip 120. In an example embodiment, the first bonding semiconductor chip 100 may include a logic buffer chip. The first bonding semiconductor chip 100 may be configured to temporarily store or process data provided by the second bonding semiconductor chip 120 and the first through fourth stacked semiconductor chips 230, 240, 250, and 260.

In an example embodiment, the first bonding semiconductor chip 100 may not include a memory cell. In addition, the first bonding semiconductor chip 100 may include a serial-parallel conversion circuit, a test logic circuit such as a design for test (DFT), a joint test action group (JTAG), and a memory built-in self-test (MBIST), and a signal interface circuit such as a physical layer (PHY).

In addition, the first bonding semiconductor chip 100 may include an error correction code (ECC) circuit therein. In an example embodiment, the first bonding semiconductor chip 100 may be configured to perform ECC encoding and decoding processes on data, and accordingly, perform detecting and correcting an error of the data.

In addition, the first bonding semiconductor chip 100 may include a frequency boosting interface (FBI) circuit therein. In an example embodiment, the first bonding semiconductor chip 100 may be configured to amplify a frequency of a data signal.

An active layer 100_AL may be formed in an upper portion of the first bonding semiconductor chip 100. In other words, the active layer 100_AL of the first bonding semiconductor chip 100 may face the second bonding semiconductor chip 120.

The active layer 100_AL of the first bonding semiconductor chip 100 may include a plurality of individual elements. For example, the plurality of individual elements may include various micro-electronic devices, for example, a complementary metal-oxide-semiconductor (CMOS) transistor, a metal-oxide-semiconductor field effect transistor (MOSFET), a large scale integration (LSI), an image sensor such as a CMOS imaging sensor (CIS), a micro-electromechanical system (MEMS), an active device, a passive device, etc.

The second bonding semiconductor chip 120 may include a semiconductor chip, which is mounted on the first bonding semiconductor chip 100 and connected to the first bonding semiconductor chip 100. In an example embodiment, the second bonding semiconductor chip 120 may include a memory semiconductor chip including a memory cell.

An active layer 120_AL may be formed in a lower portion of the second bonding semiconductor chip 120. In other words, the active layer 120_AL of the second bonding semiconductor chip 120 may face the first bonding semiconductor chip 100. In other words, the active layer 100_AL of the first bonding semiconductor chip 100 may face the active layer 120_AL of the second bonding semiconductor chip 120. In addition, the active layer 120_AL of the second bonding semiconductor chip 120 may include a plurality of individual elements.

The chip connection pad 160 may be arranged between the first bonding semiconductor chip 100 and the second bonding semiconductor chip 120, and may be a pad configured to electrically connect the first bonding semiconductor chip 100 to the second bonding semiconductor chip 120.

In an example embodiment, the chip connection pad 160 may electrically connect a plurality of individual elements in the active layer 100_AL of the first bonding semiconductor chip 100 to a plurality of individual elements in the active layer 120_AL of the second bonding semiconductor chip 120.

The wire bonding pad 180 may be arranged on the first bonding semiconductor chip 100. The wire bonding pad 180 may be arranged on the first bonding semiconductor chip 100 to be on the left side of the second bonding semiconductor chip 120.

The first through fourth stacked semiconductor chips 230, 240, 250, and 260 may be stacked on the first semiconductor structure ST1 in the vertical direction. In an example embodiment, the first through fourth stacked semiconductor chips 230, 240, 250, and 260 may include active layers in upper portions thereof. In other words, the active layers of the first through fourth stacked semiconductor chips 230, 240, 250, and 260 may face upper sides thereof.

In addition, first through fourth chip pads 235, 245, 255, and 265 may be arranged on the first through fourth stacked semiconductor chips 230, 240, 250, and 260, respectively. In addition, the first through fourth chip pads 235, 245, 255, and 265 may be electrically connected to a plurality of individual elements in the active layers of the first through fourth stacked semiconductor chips 230, 240, 250, and 260, respectively.

In an example embodiment, the first through fourth stacked semiconductor chips 230, 240, 250, and 260 may be stacked on the first semiconductor structure ST1 in a zigzag structure. For example, the second stacked semiconductor chip 240 may be mounted on the first stacked semiconductor chip 230 so that the first chip pad 235 of the first stacked semiconductor chip 230 is exposed, the third stacked semiconductor chip 250 may be mounted on the second stacked semiconductor chip 240 so that the second chip pad 245 of the second stacked semiconductor chip 240 is exposed, and the fourth stacked semiconductor chip 260 may be mounted on the third stacked semiconductor chip 250 so that the third chip pad 255 of the third stacked semiconductor chip 250 is exposed.

In an example embodiment, a semiconductor chip arranged outermost from the center of the second bonding semiconductor chip 120 of the first semiconductor structure ST1 among the first through fourth stacked semiconductor chips 230, 240, 250, and 260 may be the second stacked semiconductor chip 240. In other words, a stacking direction of the first through fourth stacked semiconductor chips 230, 240, 250, and 260 may be changed with the second stacked semiconductor chip 240 as a reference.

In an example embodiment, a length (that is, a thickness) of the second stacked semiconductor chip 240 in the vertical direction may be greater than lengths of the first stacked semiconductor chip 230, the third stacked semiconductor chip 250, and the fourth stacked semiconductor chip 260 in the vertical direction. Accordingly, the structural reliability of the semiconductor package 10 of the inventive concepts may be improved.

The adhesion layers 330, 340, 350, and 360 may fix the first stacked semiconductor chip 230 on the first semiconductor structure ST1, the second stacked semiconductor chip 240 on the first stacked semiconductor chip 230, the third stacked semiconductor chip 250 on the second stacked semiconductor chip 240, and the fourth stacked semiconductor chip 260 on the third stacked semiconductor chip 250, respectively.

In an example embodiment, the adhesion layers 330, 340, 350, and 360 may include a die attach film (DAF). In addition, a side surface of each of the adhesion layers 330, 340, 350, and 360 may be on the same plane as a side surface of each of the first through fourth stacked semiconductor chips 230, 240, 250, and 260, respectively.

The bonding wire BW may interconnect the first through fourth stacked semiconductor chips 230, 240, 250, and 260 to the first through fourth chip pads 235, 245, 255, and 265, respectively, and may include a conductive material connecting at least one of the first through fourth chip pads 235, 245, 255, and 265 to the wire bonding pad 180 of the first semiconductor structure ST1.

Figure 2:
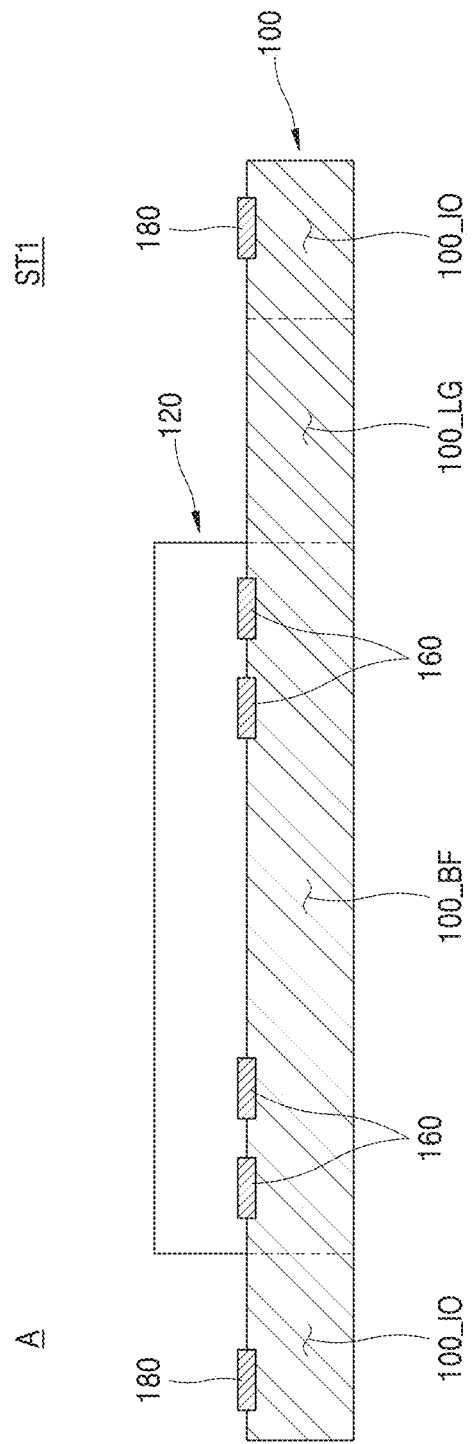
FIG. 2 is an enlarged diagram of region A in a first semiconductor structure in FIG. 1.

FIG. 2 is an enlarged diagram of region A in the first semiconductor structure ST1 in FIG. 1.

Referring to FIG. 2, the first semiconductor structure ST1 may include the first bonding semiconductor chip 100, the second bonding semiconductor chip 120, the chip connection pad 160, and the wire bonding pad 180.

In an example embodiment, the first bonding semiconductor chip 100 may include a buffer region 100_BF, a logic region 100_LG, and an input/output region 100_IO.

The buffer region 100_BF of the first bonding semiconductor chip 100 may include a region of the first bonding semiconductor chip 100, which is configured to temporarily store or process data transferred from the second bonding semiconductor chip 120 and the first through fourth stacked semiconductor chips 230, 240, 250, and 260 in FIG. 1.

In an example embodiment, the buffer region 100_BF of the first bonding semiconductor chip 100 may include a core portion (not illustrated), which temporarily stores data transferred from the second bonding semiconductor chip 120 and the first through fourth stacked semiconductor chips 230, 240, 250, and 260, and may include a circuit portion (not illustrated) including a periphery circuit for driving the second bonding semiconductor chip 120 and the first through fourth stacked semiconductor chips 230, 240, 250, and 260.

In an example embodiment, the buffer region 100_BF may be formed in a portion of the first bonding semiconductor chip 100, which overlaps the second bonding semiconductor chip 120 in the vertical direction.

The logic region 100_LG of the first bonding semiconductor chip 100 may be a region of the first bonding semiconductor chip 100 including an ECC circuit. The logic region 100_LG may include a region of the first bonding semiconductor chip 100, which is configured to perform an ECC encoding and decoding process on data transferred from the second bonding semiconductor chip 120 and the first through fourth stacked semiconductor chips 230, 240, 250, and 260, and accordingly, detect and correct an error of the data.

In an example embodiment, the logic region 100_LG may be arranged on a side portion of the buffer region 100_BF. In addition, the logic region 100_LG may not overlap the second bonding semiconductor chip 120 in the vertical direction.

In an example embodiment, the input/output region 100_IO may be a region of the first bonding semiconductor chip 100, which is provided for an input and an output of a data signal. In addition, the input/output region 100_IO may include an FBI circuit for amplifying frequencies of data signals transferred from the second bonding semiconductor chip 120 and the first through fourth stacked semiconductor chips 230, 240, 250, and 260.

In an example embodiment, the input/output region 100_IO may be provided at peripheral portions of the first bonding semiconductor chip 100, and may include a portion of the first bonding semiconductor chip 100, where the wire bonding pad 180 is arranged.

The semiconductor package 10 according to an example embodiment may include the first semiconductor structure ST1, in which the first bonding semiconductor chip 100 is bonded with the second bonding semiconductor chip 120. In addition, the first bonding semiconductor chip 100 of the first semiconductor structure ST1 may have the logic region 100_LG having the ECC circuit and the input/output region 100_IO having the FBI circuit.

Accordingly, the semiconductor package 10 including the first semiconductor structure ST1 may not include separate semiconductor chips for the ECC circuit and the FBI circuit, and thus, the semiconductor package 10 may be thin and light.

In addition, because the first bonding semiconductor chip 100 of the first semiconductor structure ST1 of the semiconductor package 10 according to an example embodiment includes the ECC circuit therein, detection and correction of data errors of the first through fourth stacked semiconductor chips 230, 240, 250, and 260 mounted on the first semiconductor structure ST1 may be promptly performed.

In addition, because the first bonding semiconductor chip 100 of the first semiconductor structure ST1 of the semiconductor package 10 according to an example embodiment includes the FBI circuit therein, the speed of the data signals of the first through fourth stacked semiconductor chips 230, 240, 250, and 260 mounted on the first semiconductor structure ST1 may be improved.

Figure 3:
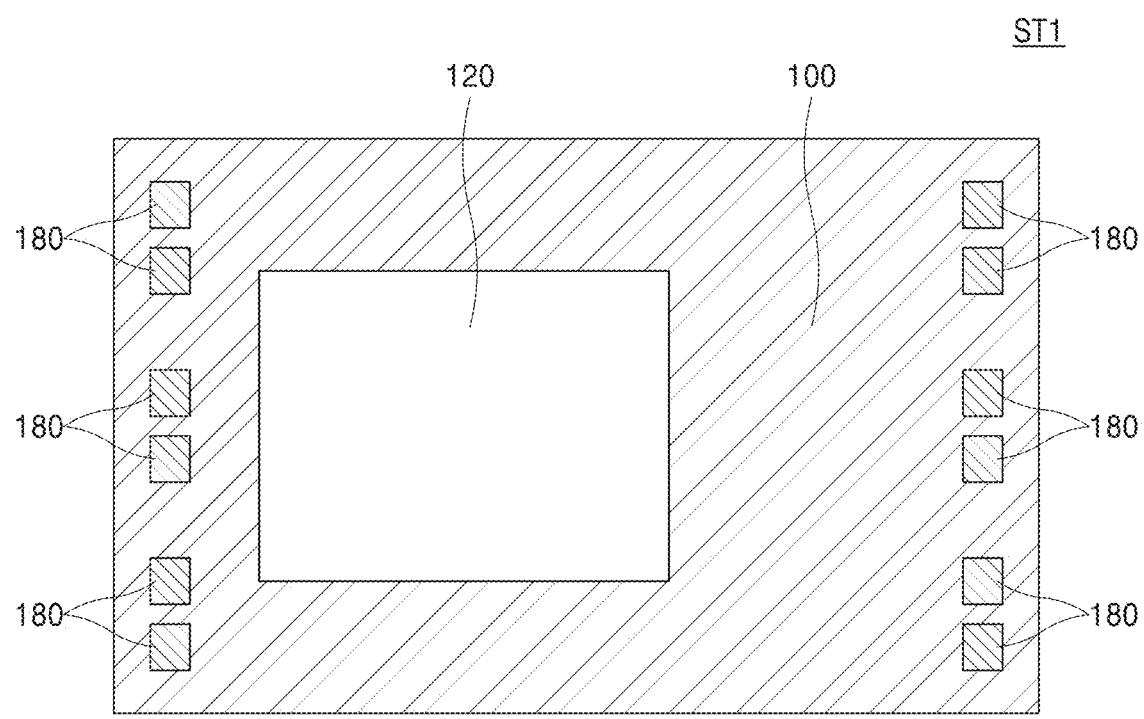
FIG. 3 is a plan view of the first semiconductor structure illustrated in FIG. 2.

FIG. 3 is a plan view of the first semiconductor structure ST1 illustrated in FIG. 2.

In an example embodiment, when the first semiconductor structure ST1 is seen in a plan view, a cross-section area of the second bonding semiconductor chip 120 in the horizontal direction may be less than a cross-section area of the first bonding semiconductor chip 100 in the horizontal direction. In addition, a length of the second bonding semiconductor chip 120 in the horizontal direction may be less than a length of the first bonding semiconductor chip 100 in the horizontal direction. Accordingly, when the first semiconductor structure ST1 is seen in a planar view, at least a portion of the first bonding semiconductor chip 100 may be exposed from a side surface of the second bonding semiconductor chip 120.

In an example embodiment, when the first semiconductor structure ST1 is seen in a planar view, the second bonding semiconductor chip 120 may be arranged on the first bonding semiconductor chip 100 so that the center of the second bonding semiconductor chip 120 is apart from the center of the first bonding semiconductor chip 100 at a certain distance. When the first through fourth stacked semiconductor chips 230, 240, 250, and 260 are mounted on the first semiconductor structure ST1 in a zigzag structure, a center of gravity of the first through fourth stacked semiconductor chips 230, 240, 250, and 260 may be close to the center of the first bonding semiconductor chip 100. Accordingly, the structural reliability of the semiconductor package (10 of FIG. 1) including the first semiconductor structure ST1 and the first through fourth stacked semiconductor chips 230, 240, 250, and 260 may be improved.

Figure 4:
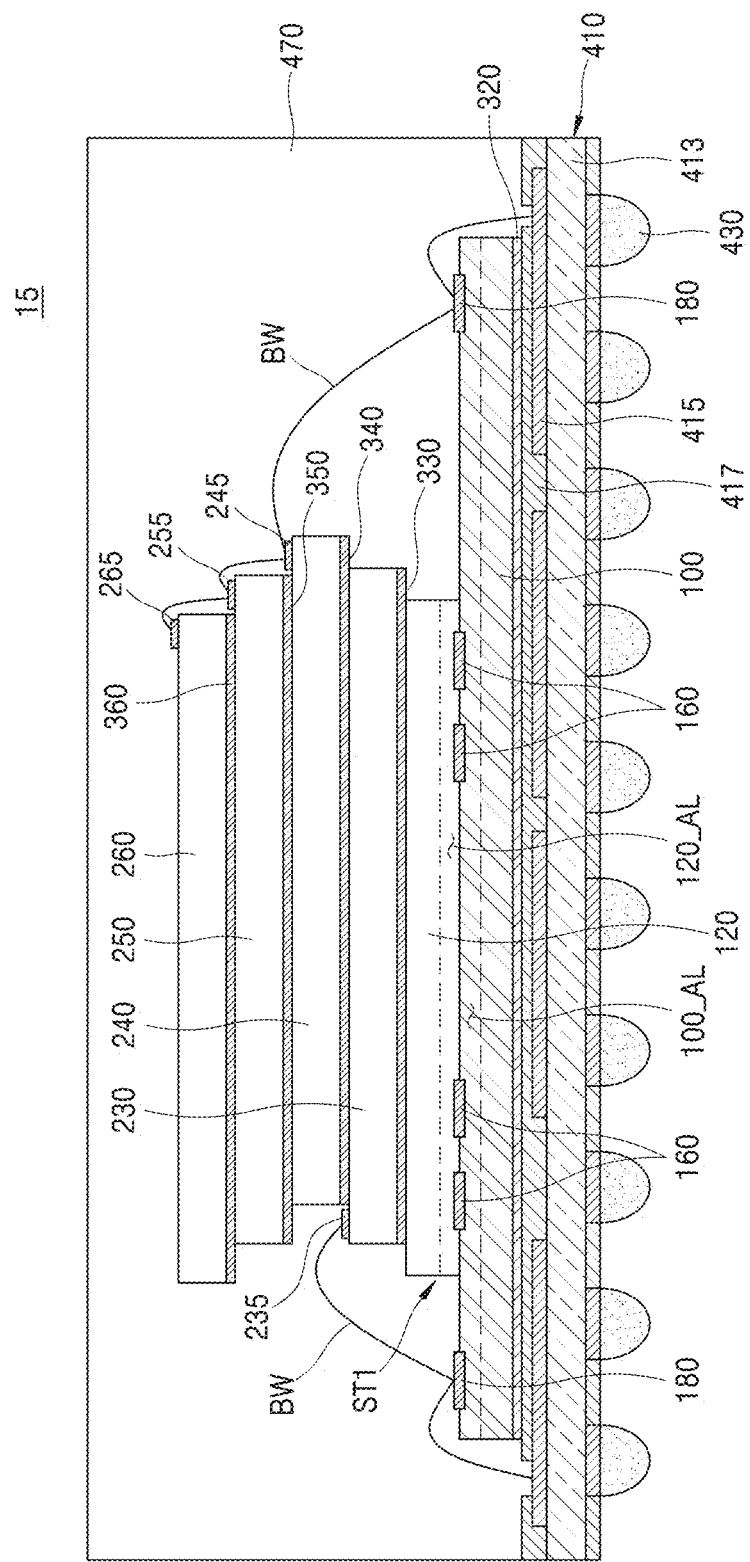
FIG. 4 is a cross-sectional view of a semiconductor package according to an example embodiment.

FIG. 4 is a cross-sectional view of a semiconductor package 15 according to an example embodiment.

Referring to FIG. 4, the semiconductor package 15 according to an example embodiment may include the first semiconductor structure ST1, the first through fourth stacked semiconductor chips 230, 240, 250, and 260, adhesion layers 320, 330, 340, 350, and 360, the bonding wire BW, a package substrate 410, a package connection terminal 430, a molding layer 470, etc.

Hereinafter, duplicate descriptions of the semiconductor package 10 of FIGS. 1 through 3 and the semiconductor package 15 of FIG. 4 are omitted and differences therebetween are mainly described.

The package substrate 410 may support the first semiconductor structure ST1, and may include a substrate electrically connecting the first semiconductor structure ST1 to the first through fourth stacked semiconductor chips 230, 240, 250, and 260.

In an example embodiment, the package substrate 410 may include a printed circuit board (PCB). For example, the package substrate 410 may include a multi-layer PCB.

In an example embodiment, the package substrate 410 may include a base board layer 413, a wiring pattern 415 extending on a surface of the base board layer 413, and a substrate insulation layer 417 arranged on the base board layer 413 and surrounding the wiring pattern 415.

The base board layer 413 may include at least one material among phenol resin, epoxy resin, and polyimide. For example, the base board layer 413 may include at least one material among frame retardant 4 (FR4), tetrafunctional epoxy, polyphenylene ether, epoxy/polyphenylene oxide, bismaleimide triazine (BT), thermount, cyanate ester, polyimide, and liquid crystal polymer.

In addition, the wiring pattern 415 may include electronically deposited (ED) copper, a rolled-annealed (RA) copper foil, a stainless steel foil, an aluminum foil, an ultra-thin copper foil, sputtered copper, a copper alloy, nickel, stainless steel or beryllium copper, etc.

In addition, the substrate insulation layer 417 may include a polyimide film, a polyester film, a flexible solder mask, photoimageable coverlay (PIC), photo-imageable solder resist, etc. For example, the substrate insulation layer 417 may be formed by thermal curing of a thermosetting ink doped by using a silk screen printing method or an inkjet method. However, the embodiment is not limited thereto, and the substrate insulation layer 417 may also be formed by laminating a polyimide film or a polyester film.

In an example embodiment, the wiring pattern 415 of the package substrate 410 may be electrically connected to the first semiconductor structure ST1, and the first through fourth stacked semiconductor chips 230, 240, 250, and 260 via the bonding wire BW.

In an example embodiment, the first semiconductor structure ST1 may be fixed on the package substrate 410 by an adhesion layer 320. For example, a side surface of the adhesion layer 320 may be on the same plane as side surface of the first bonding semiconductor chip 100.

The package connection terminal 430 may be attached to the package substrate 410, and may include a terminal configured to connect the package substrate 410 to an external device. For example, the package connection terminal 430 may be electrically connected to the wiring pattern 415.

In an example embodiment, the package connection terminal 430 may include a metal material including any one of silver (Ag), copper (Cu), and aluminum (Al).

The molding layer 470 may be arranged on the package substrate 410, and surround the first semiconductor structure ST1 and the first through fourth stacked semiconductor chips 230, 240, 250, and 260. In an example embodiment, the molding layer 470 may include epoxy molding compound (EMC). However, a material of the molding layer 470 is not limited thereto.

The semiconductor package 15 according to an example embodiment may include the first semiconductor structure ST1, in which the first bonding semiconductor chip 100 is bonded with the second bonding semiconductor chip 120. In addition, the first bonding semiconductor chip 100 of the first semiconductor structure ST1 may have the logic region 100_LG having the ECC circuit and the input/output region 100_IO having the FBI circuit.

Accordingly, the semiconductor package 15 including the first semiconductor structure ST1 may not include separate semiconductor chips for the ECC circuit and the FBI circuit, and thus, the semiconductor package 15 may be thin and light.

In addition, because the first bonding semiconductor chip 100 of the first semiconductor structure ST1 of the semiconductor package 15 according to an example embodiment includes the ECC circuit therein, detection and correction of data errors of the first through fourth stacked semiconductor chips 230, 240, 250, and 260 mounted on the first semiconductor structure ST1 may be promptly performed.

In addition, because the first bonding semiconductor chip 100 of the first semiconductor structure ST1 of the semiconductor package 15 according to an example embodiment includes the FBI circuit therein, the speed of the data signals of the first through fourth stacked semiconductor chips 230, 240, 250, and 260 mounted on the first semiconductor structure ST1 may be improved.

Figure 5:
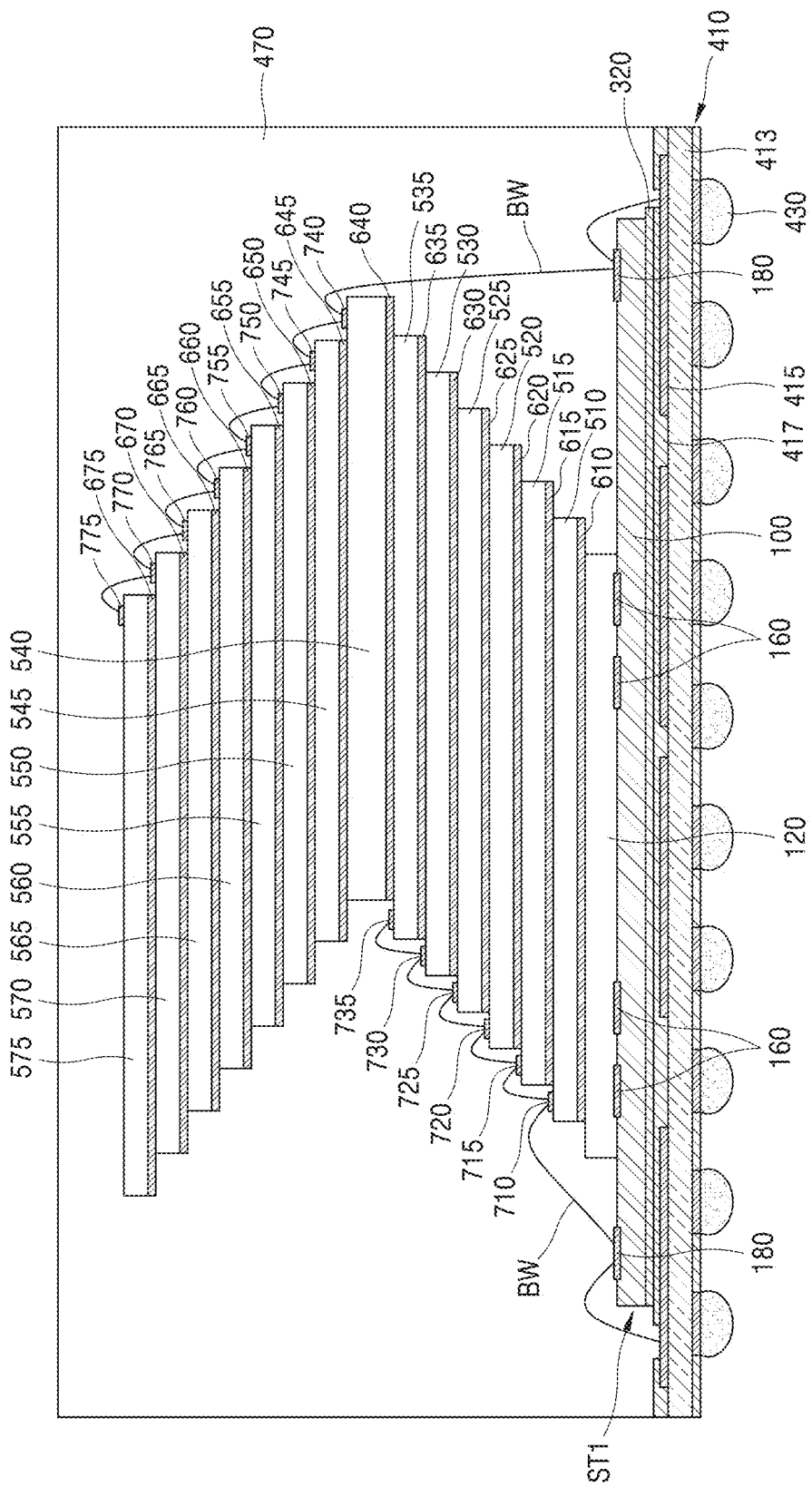
FIG. 5 is a cross-sectional view of a semiconductor package according to an example embodiment.

FIG. 5 is a cross-sectional view of a semiconductor package 20 according to an embodiment.

Referring to FIG. 5, the semiconductor package 20 may include a plurality of stacked semiconductor chips 510 through 575. In addition, the number of stacked semiconductor chips 510 through 575 is not limited to as illustrated in FIG. 5.

In addition, a plurality of adhesion layers 610 through 675 may be attached to lower portions of the plurality of stacked semiconductor chips 510 through 575, respectively. For example, the plurality of adhesion layers 610 through 675 may be arranged between the first semiconductor structure ST1 and a first stacked semiconductor chip 510, or between the plurality of stacked semiconductor chips 510 through 575, respectively.

In addition, a plurality of chip pads 710 through 775 may be respectively arranged on the plurality of stacked semiconductor chips 510 through 575. In addition, the plurality of chip pads 710 through 775 may be electrically connected to a plurality of individual elements in the active layers of the plurality of stacked semiconductor chips 510 through 575, respectively.

In an example embodiment, the plurality of stacked semiconductor chips 510 through 575 may be stacked on the first semiconductor structure ST1 in a zigzag structure. For example, the plurality of stacked semiconductor chips 510 through 575 may be stacked in a zigzag structure so that the plurality of chip pads 710 through 775 are exposed.

In an example embodiment, a length the stacked semiconductor chip 540 arranged outermost from the center of the second bonding semiconductor chip 120 of the first semiconductor structure ST1 among the plurality of stacked semiconductor chips 510 through 575, the length being in the vertical direction, may be greater than a length of the other stacked semiconductor chips 510 through 535, and 545 through 575 in the vertical direction. Accordingly, the structural reliability of the semiconductor package 20 of the inventive concepts may be improved.

Figure 6:
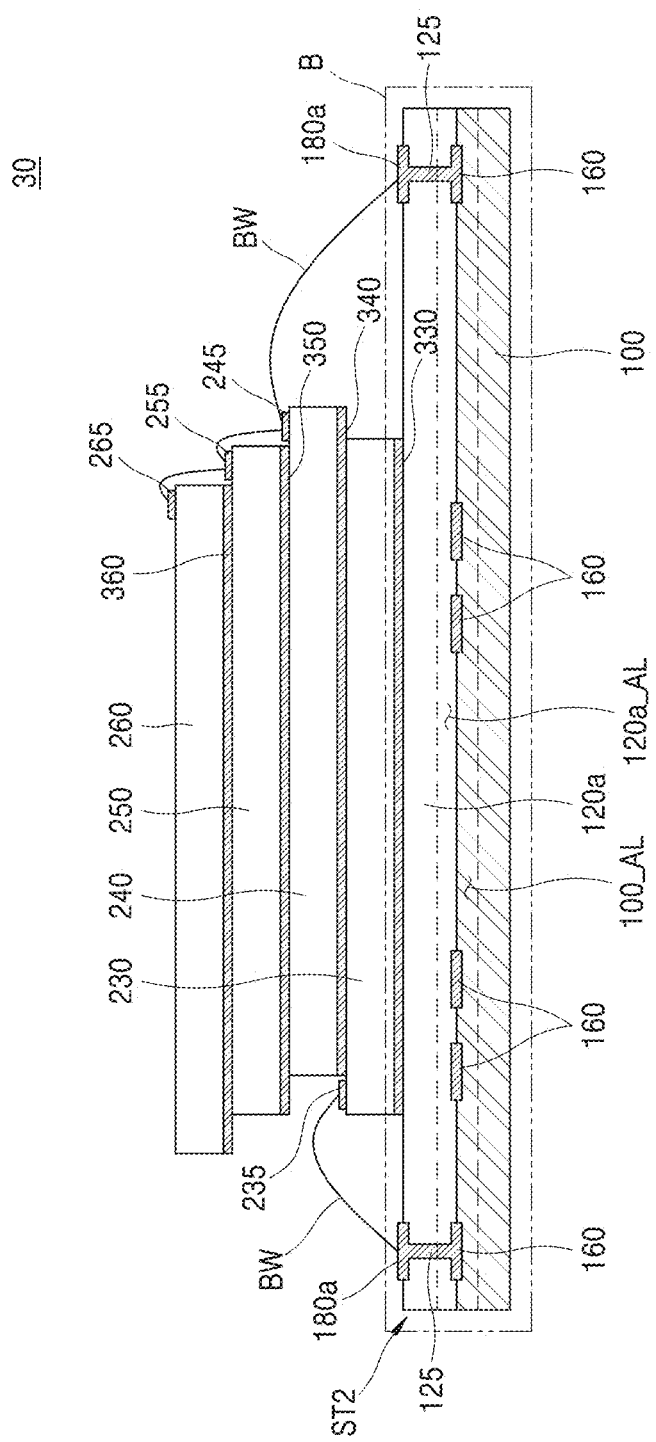
FIG. 6 is a cross-sectional view of a semiconductor package according to an example embodiment.

FIG. 6 is a cross-sectional view of a semiconductor package 30 according to an embodiment.

Referring to FIG. 6, the semiconductor package 30 according to an example embodiment may include a second semiconductor structure ST2, the first through fourth stacked semiconductor chips 230, 240, 250, and 260, the adhesion layers 330, 340, 350, and 360, and the bonding wire BW. In addition, the second semiconductor structure ST2 may include the first bonding semiconductor chip 100, a second bonding semiconductor chip 120a, the chip connection pad 160, the wire bonding pad 180, an upper penetration electrode 125, etc.

Hereinafter, duplicate descriptions of the semiconductor package 10 of FIG. 1 and the semiconductor package 30 of FIG. 6 are omitted and differences therebetween are mainly described.

The second semiconductor structure ST2 may include a structure in which the first semiconductor chip 100 is bonded with the second bonding semiconductor chip 120a. In an example embodiment, the second semiconductor structure ST2 may be formed by using a wafer-to-wafer bonding process. For example, the first bonding semiconductor chip 100 and the second bonding semiconductor chip 120a may be provided at the wafer level. After the second bonding semiconductor chip 120a at the wafer level is bonded with the first bonding semiconductor chip 100 at the wafer level, an individualization process of the bonding structure may be performed. Accordingly, the second semiconductor structure ST2 of the inventive concepts may be formed.

The first bonding semiconductor chip 100 may include a semiconductor chip arranged under the second bonding semiconductor chip 120a. In an example embodiment, the first bonding semiconductor chip 100 may include a logic buffer chip.

In addition, the first bonding semiconductor chip 100 may not include a memory cell. In addition, the first bonding semiconductor chip 100 may include a logic buffer chip including a serial-parallel conversion circuit, a test logic circuit such as a DFT, a JTAG, and an MBIST, and a signal interface circuit such as a PHY.

In an example embodiment, the first bonding semiconductor chip 100 may be configured to temporarily store or process data provided by the second bonding semiconductor chip 120*a* and the first through fourth stacked semiconductor chips 230, 240, 250, and 260.

In other words, the first bonding semiconductor chip 100 may include a buffer region configured to store or to process data of at least any one of the second bonding semiconductor chip 120*a* and the first through fourth stacked semiconductor chips 230, 240, 250, and 260.

In addition, the first bonding semiconductor chip 100 may include the ECC circuit therein. In an example embodiment, the first bonding semiconductor chip 100 may perform ECC encoding and decoding processes on data, and accordingly, may be configured to detect and correct an error of the data.

In other words, the first bonding semiconductor chip 100 may include a logic region including the ECC circuit configured to detect and correct a data error of at least one of the second bonding semiconductor chip 120*a*, and the first through fourth stacked semiconductor chips 230, 240, 250, and 260.

In addition, the first bonding semiconductor chip 100 may include the FBI circuit therein. In an example embodiment, the first bonding semiconductor chip 100 may be configured to amplify a frequency of a data signal.

In other words, the first bonding semiconductor chip 100 may include an input/output region including the FBI circuit configured to amplify a frequency of a data signal of at least one of the second bonding semiconductor chip 120*a*, and the first through fourth stacked semiconductor chips 230, 240, 250, and 260.

In an example embodiment, the active layer 100_AL may be formed in an upper portion of the first bonding semiconductor chip 100. In other words, the active layer 100_AL of the first bonding semiconductor chip 100 may face the second bonding semiconductor chip 120*a*.

The second bonding semiconductor chip 120*a* may include a semiconductor chip, which is mounted on the first bonding semiconductor chip 100, and connected to the first bonding semiconductor chip 100. In an example embodiment, the second bonding semiconductor chip 120*a* may include a memory semiconductor chip including a memory cell.

An active layer 120*a*_AL may be formed in a lower portion of the second bonding semiconductor chip 120*a*. In other words, the active layer 120*a*_AL of the second bonding semiconductor chip 120*a* may face the first bonding semiconductor chip 100. In other words, the active layer 100_AL of the first bonding semiconductor chip 100 may face the active layer 120*a*_AL of the second bonding semiconductor chip 120*a*. In addition, the active layer 120*a*_AL of the second bonding semiconductor chip 120*a* may each include a plurality of individual elements.

In an example embodiment, a side surface of the first bonding semiconductor chip 100 may be on the same plane as a side surface of the second bonding semiconductor chip 120*a*.

The chip connection pad 160 may be arranged between the first bonding semiconductor chip 100 and the second bonding semiconductor chip 120*a*, and may include a pad configured to electrically connect the first bonding semiconductor chip 100 to the second bonding semiconductor chip 120*a*.

In an example embodiment, the chip connection pad 160 may electrically connect a plurality of individual elements in the active layer 100_AL of the first bonding semiconductor chip 100 to a plurality of individual elements in the active layer 120*a*_AL of the second bonding semiconductor chip 120*a*.

A wire bonding pad 180*a* may be arranged on the second bonding semiconductor chip 120*a*. In addition, as to be described below, a wire bonding pad 180*a* may be electrically connected to at least any one of the plurality of chip connection pads 160 via the upper penetration electrode 125.

The upper penetration electrode 125 may penetrate at least a portion of the second bonding semiconductor chip 120*a* in the vertical direction, and may electrically connect the wire bonding pad 180*a* to the chip connection pad 160.

In an example embodiment, the upper penetration electrode 125 may include a conductive plug (not illustrated) and a conductive barrier layer (not illustrated). The conductive plug may penetrate at least a portion of the second bonding semiconductor chip 120*a*, and the conductive barrier layer may surround side walls of the conductive plug. For example, the conductive plug may have a circular shape, and the conductive barrier layer may have a cylindrical shape surrounding the side walls of the conductive plug.

In an example embodiment, the wire bonding pad 180*a* may be electrically connected to the first through fourth stacked semiconductor chips 230, 240, 250, and 260 via the bonding wire BW.

Figure 7:
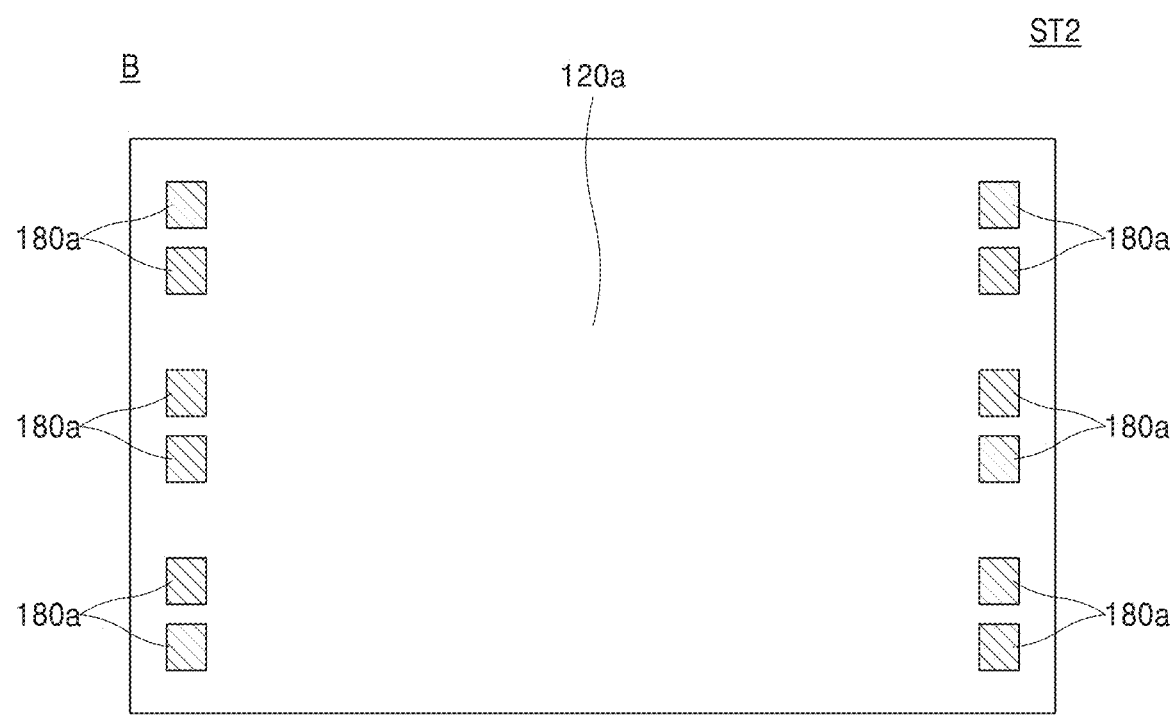
FIG. 7 is a plan view of region B in a second semiconductor structure in FIG. 6.

FIG. 7 is a plan view of region B in a second semiconductor structure ST2 in FIG. 6.

Referring to FIG. 7, when the second semiconductor structure ST2 is seen in a plan view, the second bonding semiconductor chip 120*a* may be observed, but the first bonding semiconductor chip 100 may not be observed.

In an example embodiment, when the second semiconductor structure ST2 is seen in a plan view, a cross-section area of the second bonding semiconductor chip 120*a* in the horizontal direction may be substantially the same as a cross-section area of the first bonding semiconductor chip 100 in the horizontal direction. In addition, a length (that is, a width) of the second bonding semiconductor chip 120*a* in the horizontal direction may be substantially the same as the length of the first bonding semiconductor chip 100 in the horizontal direction.

Figure 8:
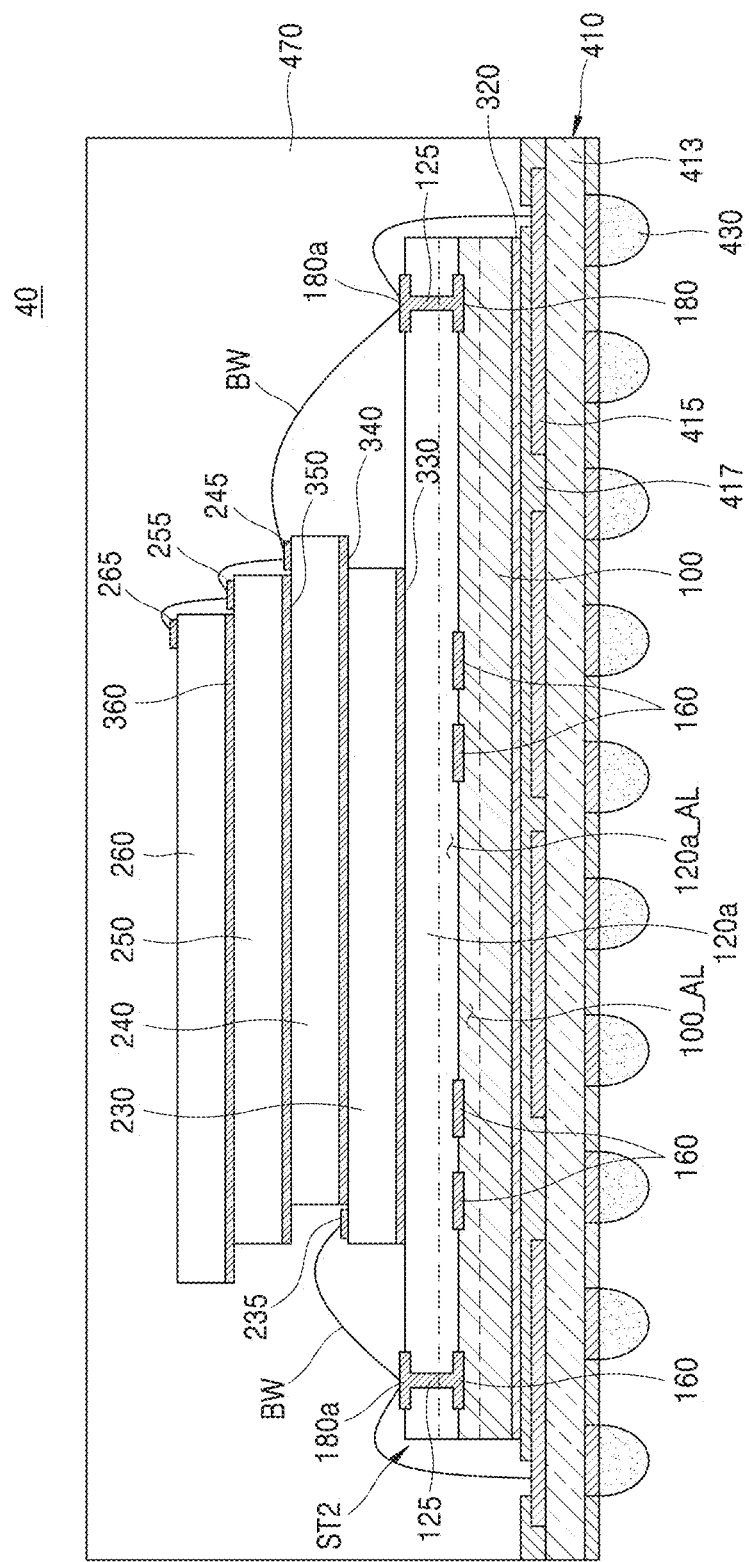
FIG. 8 is a cross-sectional view of a semiconductor package according to an example embodiment.

FIG. 8 is a cross-sectional view of a semiconductor package 40 according to an example embodiment.

Referring to FIG. 8, the semiconductor package 40 according to an example embodiment may include the second semiconductor structure ST2, the first through fourth stacked semiconductor chips 230, 240, 250, and 260, the adhesion layers 330, 340, 350, and 360, the bonding wire BW, the package substrate 410, the package connection terminal 430, the molding layer 470, etc.

Hereinafter, duplicate descriptions of the semiconductor package 30 of FIG. 6 and the semiconductor package 40 of FIG. 8 are omitted and differences therebetween are mainly described.

The package substrate 410 may support the second semiconductor structure ST2, and may include a substrate, which is electrically connected to the second semiconductor structure ST2 and the first through fourth stacked semiconductor chips 230, 240, 250, and 260. In an example embodiment, the package substrate 410 may include a PCB.

In an example embodiment, the package substrate 410 may include the base board layer 413, the wiring pattern 415 extending on a surface of the base board layer 413, and the substrate insulation layer 417 arranged on the base board layer 413 and surrounding the wiring pattern 415.

In an example embodiment, the wiring pattern 415 of the package substrate 410 may be electrically connected to the second semiconductor structure ST2, and the first through fourth stacked semiconductor chips 230, 240, 250, and 260 via the bonding wire BW.

The package connection terminal 430 may be attached to the package substrate 410, and may include a terminal configured to connect the package substrate 410 to an external device. For example, the package connection terminal 430 may be electrically connected to the wiring pattern 415.

The molding layer 470 may be arranged on the package substrate 410, and surround the second semiconductor structure ST2 and the first through fourth stacked semiconductor chips 230, 240, 250, and 260. In an example embodiment, the molding layer 470 may include EMC.

The semiconductor package 40 according to an example embodiment may include the second semiconductor structure ST2, in which the first bonding semiconductor chip 100 is bonded with the second bonding semiconductor chip 120a. In addition, the first bonding semiconductor chip 100 of the second semiconductor structure ST2 may include the ECC circuit and the FBI circuit therein. Accordingly, the semiconductor package 40 including the second semiconductor structure ST2 may not include separate semiconductor chips for the ECC circuit and the FBI circuit, and thus, the semiconductor package 40 may be thin and light.

In addition, because the first bonding semiconductor chip 100 of the second semiconductor structure ST2 of the semiconductor package 40 according to an example embodiment includes the ECC circuit therein, detection and correction of data errors of the first through fourth stacked semiconductor chips 230, 240, 250, and 260 mounted on the second semiconductor structure ST2 may be promptly performed.

In addition, because the first bonding semiconductor chip 100 of the second semiconductor structure ST2 of the semiconductor package 40 according to an example embodiment includes the FBI circuit therein, the speed of the data signals of the first through fourth stacked semiconductor chips 230, 240, 250, and 260 mounted on the second semiconductor structure ST2 may be improved.

Figure 9:
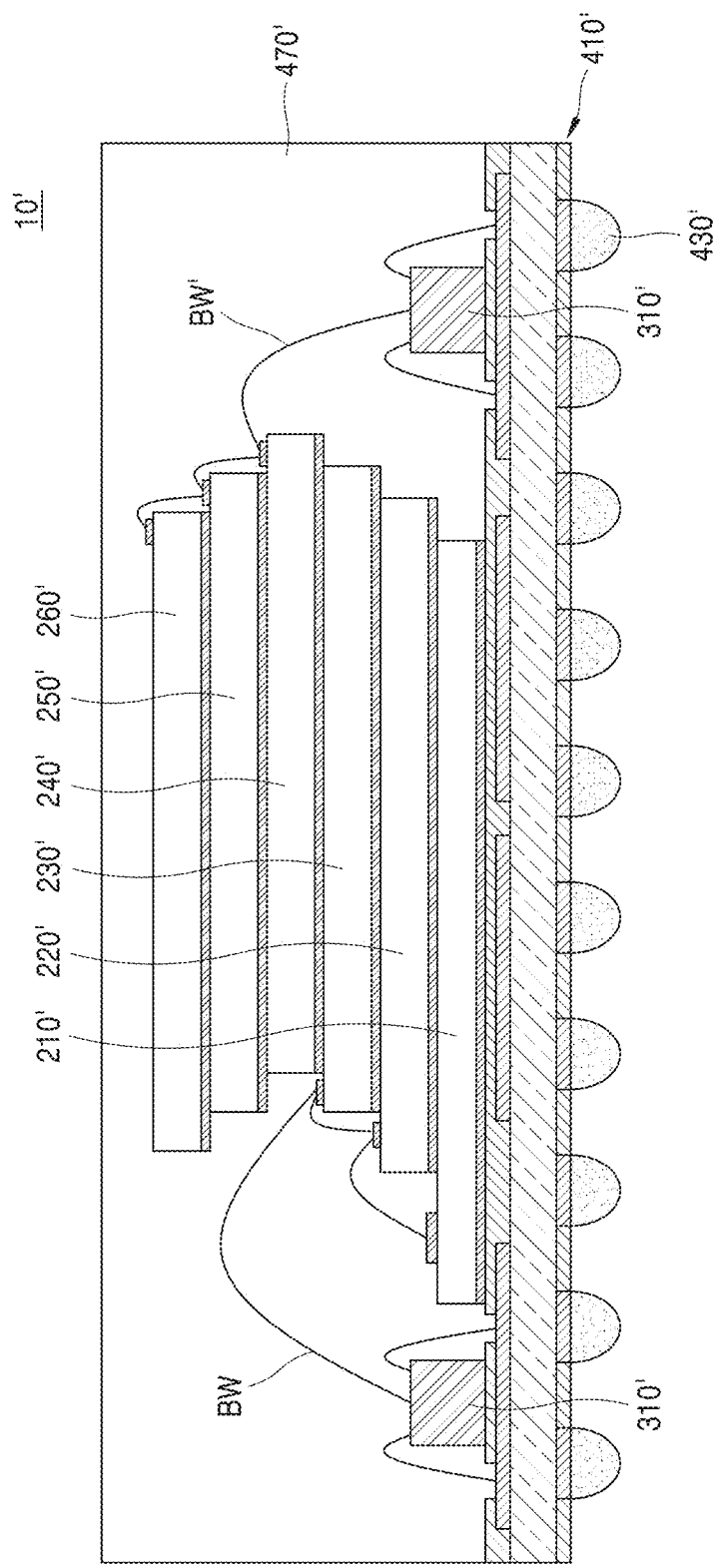
FIG. 9 is a cross-sectional view of a semiconductor package according to a comparative example.

FIG. 9 is a cross-sectional view of a semiconductor package 10' according to a comparative example.

The semiconductor package 10' according to the comparative example may include a plurality of stacked semiconductor chips 210' through 260', an FBI chip 310' including an FBI circuit, a package substrate 410', a package connection terminal 430', a bonding wire BW', a molding layer 470', etc.

Active layers of the plurality of stacked semiconductor chips 210' through 260' of the semiconductor package 10' according to the comparative example may be formed in upper portions of the plurality of stacked semiconductor chips 210' through 260'.

In addition, the stacked semiconductor chip 210' at the lowermost portion of the plurality of stacked semiconductor chips 210' through 260' may include a buffer chip, which does not include a memory cell. In addition, the stacked semiconductor chip 210' may not include a FBI circuit and an ECC circuit therein.

The FBI chip 310' including the FBI circuit may be mounted on the package substrate 410', and the FBI chip 310' may be electrically connected to the package substrate 410' via the bonding wire BW'. In addition, data signals of the plurality of stacked semiconductor chips 220' through 260' may be transferred to the FBI chip 310' via the package substrate 410', and frequencies of the data signals may be amplified by the FBI chip 310'.

Figure 10:
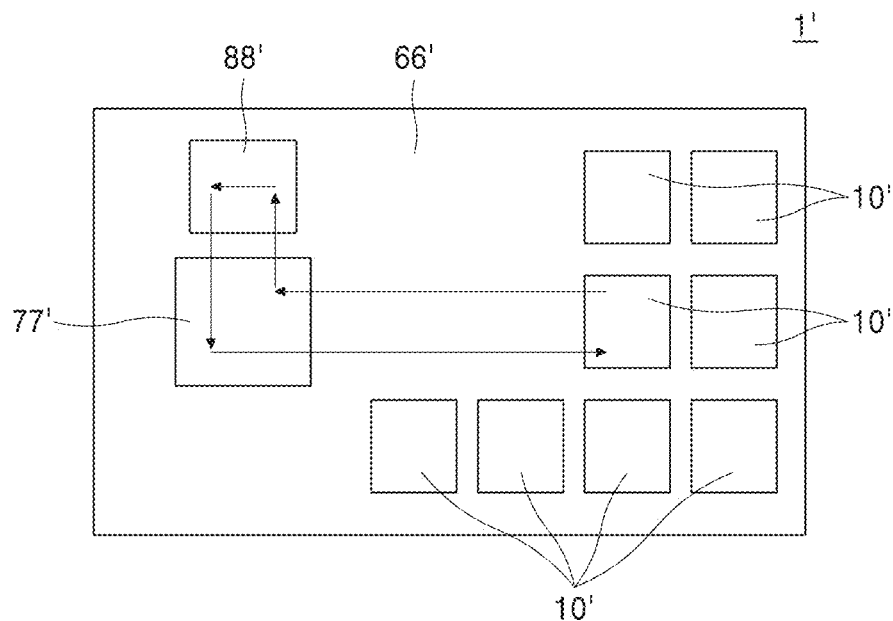
FIG. 10 is a cross-sectional view of a semiconductor device according to a comparative example.

FIG. 10 is a cross-sectional view of a semiconductor device 1' according to a comparative example.

The semiconductor device 1' according to the comparative example may include a semiconductor device including the semiconductor package 10' according to the comparative example of FIG. 9. In addition, arrows illustrated in FIG. 10 may denote a path, through which correction of an error of data stored in the semiconductor package 10' is performed.

Referring to FIG. 10, the semiconductor device 1' according to the comparative example may include a substrate 66', a plurality of semiconductor packages 10', a controller 77', and a dynamic random access memory (RAM) (DRAM) package 88'.

The stacked semiconductor chip 210' arranged at the lower portion of the plurality of semiconductor packages 210' through 260' in FIG. 9 included in the plurality of semiconductor packages 10' may not include an ECC circuit for correcting the data error. The controller 77' of the semiconductor device 1' may include an ECC circuit.

Accordingly, when an error occurs in data of the plurality of stacked semiconductor chips 220' through 260' included in the plurality of semiconductor packages 10', the data may be required to be moved to the controller 77' and corrected.

The data of the plurality of stacked semiconductor chips 220' through 260' included in the plurality of semiconductor packages 10' may be moved to the controller 77'. In addition, the data may be moved from the controller 77' to the DRAM package 88', and temporarily stored in the DRAM package 88'. In addition, the data may be moved from the DRAM package 88' back to the controller 77', and an error of the data may be corrected by the ECC circuit. In addition, the error-corrected data may be moved to the plurality of semiconductor packages 10', and stored in the plurality of stacked semiconductor chips 220' through 260'.

Figure 11:
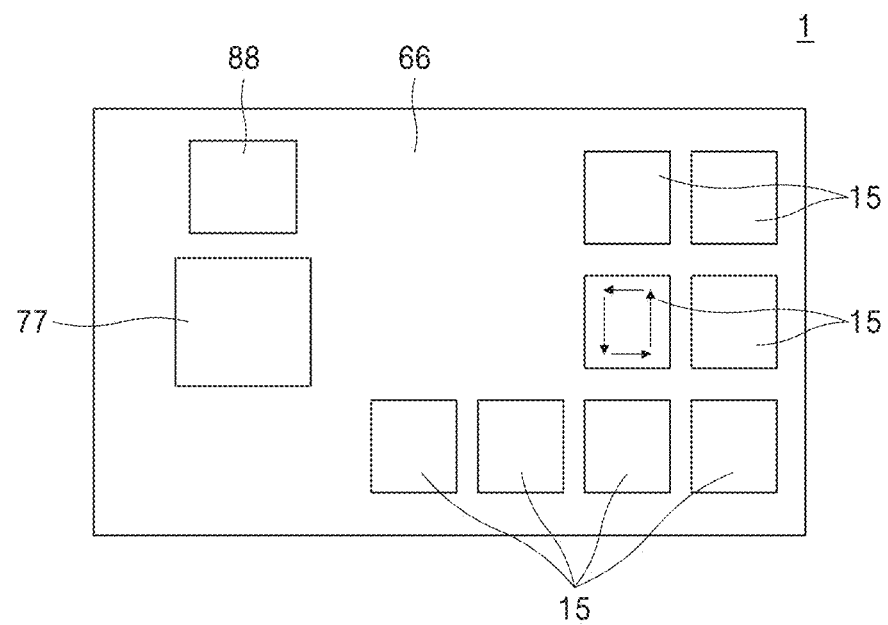
FIG. 11 is a cross-sectional view of a semiconductor device according to an example embodiment.

FIG. 11 is a cross-sectional view of a semiconductor device 1 according to an example embodiment.

The semiconductor device 1 according to an example embodiment may include a semiconductor device including the semiconductor package 15 described with reference to FIG. 4. In addition, arrows illustrated in FIG. 11 may denote a path in which correction of an error of data stored in the semiconductor package 15 is performed.

Referring to FIG. 11, the semiconductor device 1 according to an example embodiment may include a substrate 66, a plurality of semiconductor packages 15, a controller 77, and a DRAM package 88. For example, the semiconductor device 1 may include a solid state drive (SSD) package.

As described above, the plurality of semiconductor packages 15 may include the first semiconductor structure (ST1 in FIG. 4), and the first semiconductor structure ST1 may include the first bonding semiconductor chip (100 in FIG. 4).

The first bonding semiconductor chip 100 may include, therein, the ECC circuit configured to detect and correct an error of data of the second bonding semiconductor chip (120 in FIG. 4) and the first through fourth stacked semiconductor chips (230, 240, 250, and 260 in FIG. 4).

In addition, the first bonding semiconductor chip 100 may include the FBI circuit configured to amplify the frequencies of the data signals of the second bonding semiconductor chip 120 and the first through fourth stacked semiconductor chips 230, 240, 250, and 260. Accordingly, the semiconductor package 15 of the inventive concepts may not separately include the FBI chip 310' in FIG. 7.

When the first bonding semiconductor chip 100 of the first semiconductor structure ST1 of the semiconductor package 15 includes the ECC circuit, and an error occurs in the data of the second bonding semiconductor chip 120 and the first through fourth stacked semiconductor chips 230, 240, 250, and 260, the data may be corrected by the first semiconductor chip 100 of the semiconductor package 15.

The data included in the second bonding semiconductor chip 120 and the first through fourth stacked semiconductor chips 230, 240, 250, and 260 may be moved to the first bonding semiconductor chip 100, and the error of the data may be corrected by using the ECC circuit of the first bonding semiconductor chip 100. In addition, the error-corrected data may be stored in the second bonding semiconductor chip 120 and the first through fourth stacked semiconductor chips 230, 240, 250, and 260.

The semiconductor package 15 of the semiconductor device 1 according to an example embodiment may include the first semiconductor structure ST1, in which the first bonding semiconductor chip 100 is bonded with the second bonding semiconductor chip 120. In addition, the first bonding semiconductor chip 100 of the first semiconductor structure ST1 may include the ECC circuit and the FBI circuit, therein.

Accordingly, the semiconductor package 15 of the semiconductor device 1 may not include separate semiconductor chips for the ECC circuit and the FBI circuit, and thus, the semiconductor device 1 including the semiconductor package 15 may be thin and light.

In addition, because the first bonding semiconductor chip 100 of the first semiconductor structure ST1 of the semiconductor package 15 according to an example embodiment includes the ECC circuit therein, detection and correction of data errors of the first through fourth stacked semiconductor chips 230, 240, 250, and 260 mounted on the first semiconductor structure ST1 may be promptly performed in the semiconductor package 15. In other words, the speed of detecting and correcting the data error of semiconductor device 1 may be improved.

In addition, because the first bonding semiconductor chip 100 of the first semiconductor structure ST1 of the semiconductor package 15 according to an example embodiment includes the FBI circuit therein, the speed of the data signals of the first through fourth stacked semiconductor chips 230, 240, 250, and 260 mounted on the first semiconductor structure ST1 may be improved. In other words, the speed of the data signal of the semiconductor device 1 including the semiconductor package 15 may be improved, and performance of the semiconductor device 1 may be improved.

Figure 12:
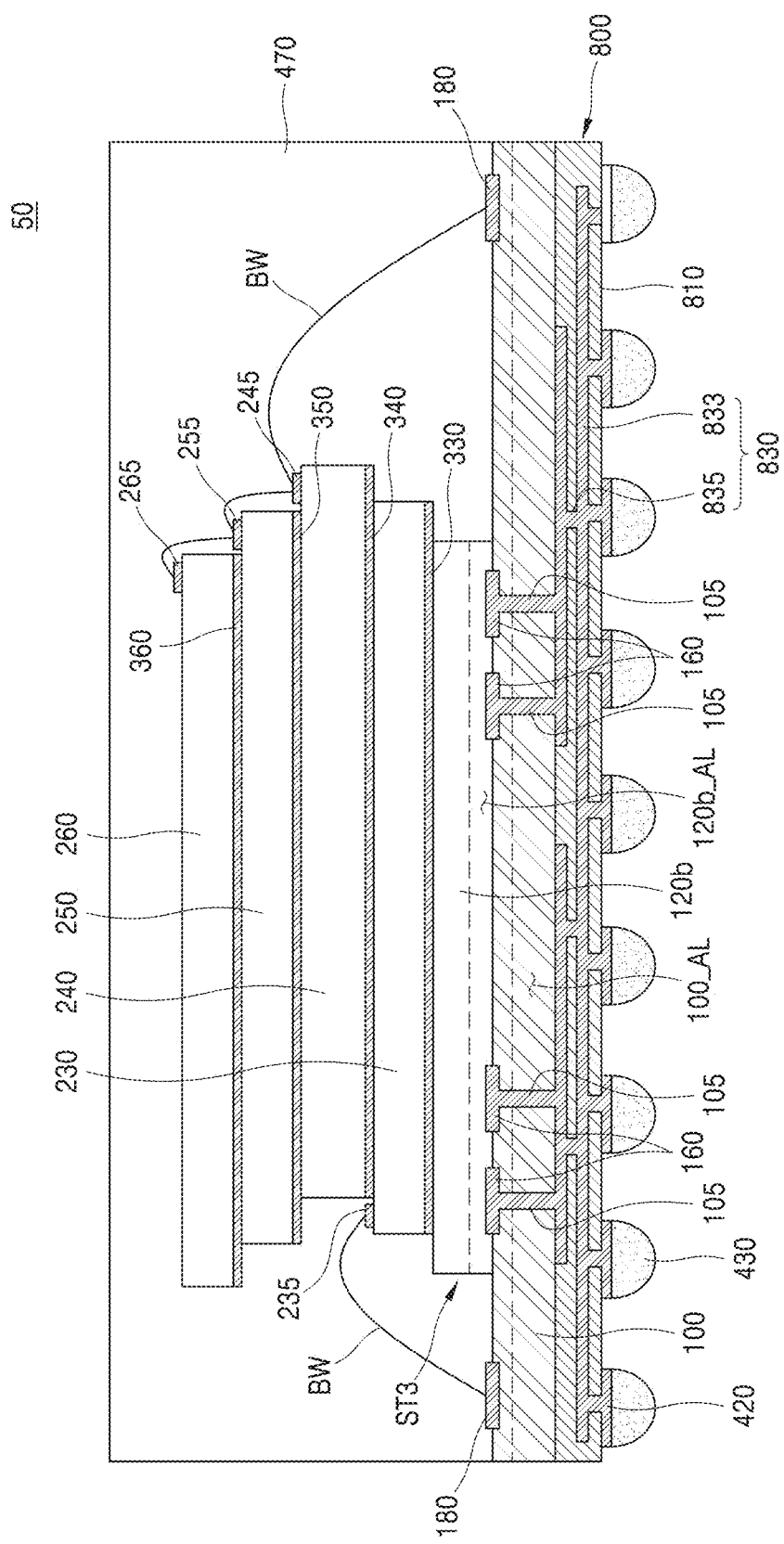
FIG. 12 is a cross-sectional view of a semiconductor package according to an example embodiment.

FIG. 12 is a cross-sectional view of a semiconductor package 50 according to an embodiment.

Referring to FIG. 12, the semiconductor package 50 according to an example embodiment may include a third semiconductor structure ST3, the first through fourth stacked semiconductor chips 230, 240, 250, and 260, the adhesion layers 330, 340, 350, and 360, the bonding wire BW, a redistribution structure 800, the package connection terminal 430, the molding layer 470, etc.

Hereinafter, duplicate descriptions of the semiconductor package 15 of FIG. 4 and the semiconductor package 50 of FIG. 12 are omitted and differences therebetween are mainly described.

The third semiconductor structure ST3 may include the first bonding semiconductor chip 100, a second bonding semiconductor chip 120b, the chip connection pad 160, the wire bonding pad 180, a lower penetration electrode 105, etc.

The third semiconductor structure ST3 may include a structure in which the first semiconductor chip 100 is bonded with the second bonding semiconductor chip 120b. In an example embodiment, the third semiconductor structure ST3 may be formed by using a die-to-wafer bonding process. For example, the first bonding semiconductor chip 100 may be provided at the wafer level, and the second bonding semiconductor chip 120b may be provided at the die level. After the second bonding semiconductor chip 120a at the die level is bonded with the first bonding semiconductor chip 100 at the wafer level, an individualization process of a bonding structure may be performed. Accordingly, the third semiconductor structure ST3 of the inventive concepts may be formed.

The first bonding semiconductor chip 100 may include a semiconductor chip arranged under the second bonding semiconductor chip 120b. In an example embodiment, the first bonding semiconductor chip 100 may include a logic buffer chip. The first bonding semiconductor chip 100 may be configured to temporarily store or process data provided by the second bonding semiconductor chip 120b and the first through fourth stacked semiconductor chips 230, 240, 250, and 260.

In an example embodiment, the first bonding semiconductor chip 100 may not include a memory cell. In addition, the first bonding semiconductor chip 100 may include a logic buffer chip including a serial-parallel conversion circuit, a test logic circuit such as DFT, JTAG, and MBIST, and a signal interface circuit such as PHY.

In addition, the first bonding semiconductor chip 100 may include the ECC circuit therein. In an example embodiment, the first bonding semiconductor chip 100 may perform ECC encoding and decoding processes on data, and accordingly, may be configured to detect and correct an error of the data.

In addition, the first bonding semiconductor chip 100 may include the FBI circuit therein. In an example embodiment, the first bonding semiconductor chip 100 may be configured to amplify a frequency of a data signal.

An active layer 100_AL may be formed in an upper portion of the first bonding semiconductor chip 100. In other words, the active layer 100_AL of the first bonding semiconductor chip 100 may face the second bonding semiconductor chip 120b.

The second bonding semiconductor chip 120b may include a semiconductor chip, which is mounted on the first bonding semiconductor chip 100, and connected to the first bonding semiconductor chip 100. In an example embodiment, the second bonding semiconductor chip 120b may include a memory semiconductor chip including a memory cell.

An active layer 120b_AL may be formed in a lower portion of the second bonding semiconductor chip 120b. In other words, the active layer 120b_AL of the second bonding semiconductor chip 120b may face the first bonding semiconductor chip 100. In other words, the active layer 100_AL of the first bonding semiconductor chip 100 may face the active layer 120b_AL of the second bonding semiconductor chip 120b. In addition, the active layer 120b_AL of the second bonding semiconductor chip 120b may include a plurality of individual elements.

In an example embodiment, a side surface of the first bonding semiconductor chip 100 may be on the same plane as a side surface of the second bonding semiconductor chip 120b.

The chip connection pad 160 may be arranged between the first bonding semiconductor chip 100 and the second bonding semiconductor chip 120b, and may include a pad configured to electrically connect the first bonding semiconductor chip 100 to the second bonding semiconductor chip 120b.

In an example embodiment, the chip connection pad 160 may electrically connect a plurality of individual elements in the active layer 100_AL of the first bonding semiconductor chip 100 to a plurality of individual elements in the active layer 120b_AL of the second bonding semiconductor chip 120b.

The wire bonding pad 180 may be arranged on the first bonding semiconductor chip 100. In an example embodiment, the wire bonding pad 180 may be arranged on the first bonding semiconductor chip 100 so that the wire bonding pad is on the left side of the second bonding semiconductor chip 120b.

The lower penetration electrode 105 may penetrate at least a portion of the first bonding semiconductor chip 100 in the vertical direction, and may electrically connect the chip connection pad 160 to a redistribution line pattern 833 to be described below.

In an example embodiment, the lower penetration electrode 105 may include a conductive plug (not illustrated) and a conductive barrier layer (not illustrated). The conductive plug may penetrate at least a portion of the first bonding semiconductor chip 100, and the conductive barrier layer may surround side walls of the conductive plug. For example, the conductive plug may have a circular shape, and the conductive barrier layer may have a cylindrical shape surrounding the side walls of the conductive plug.

The redistribution structure 800 may support the third semiconductor structure ST3. The redistribution structure 800 may be arranged under the first bonding semiconductor chip 100 of the third semiconductor structure ST3.

The redistribution structure 800 may include a redistribution insulation layer 810 and a redistribution pattern 830. In addition, the redistribution pattern 830 may include the redistribution line pattern 833 and a redistribution via pattern 835. The redistribution insulation layer 810 may include a layer, including an insulation material, which surrounds the redistribution line pattern 833 and the redistribution via pattern 835.

In an example embodiment, a material of the redistribution insulation layer 810 may include oxide or nitride. For example, a material of the redistribution insulation layer 810 may include silicon oxide or silicon nitride. In addition, a material of the redistribution insulation layer 810 may include a photo imageable dielectric (PID) material or photosensitive polyimide (PSPI).

The redistribution line pattern 833 may include a pattern, including a conductive material, which extends in the redistribution insulation layer 810 in the horizontal direction. In an example embodiment, the redistribution line pattern 833 may form a plurality of layers in the redistribution insulation layer 810.

In addition, the redistribution via pattern 835 may include a pattern, including a conductive material, which extends in the redistribution insulation layer 810 in the vertical direction. In an example embodiment, the redistribution via pattern 835 may extend in the redistribution insulation layer 810 in the vertical direction, interconnect a plurality of redistribution line patterns 833 to each other, or interconnect the redistribution line pattern 833 to a package connection pad 420.

In an example embodiment, materials of the redistribution line pattern 833 and the redistribution via pattern 835 may include Cu. However, the embodiment is not limited thereto, and the materials of the redistribution line pattern 833 and the redistribution via pattern 835 may include a metal such as nickel (Ni), gold (Au), Ag, Al, tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), and ruthenium (Ru), or an alloy thereof.

In an example embodiment, the redistribution pattern 830 may be electrically connected to the lower penetration electrode 105. In addition, the redistribution pattern 830 may be electrically connected to the chip connection pad 160 via the lower penetration electrode 105.

The package connection pad 420 may be arranged under the redistribution structure 800, and may be electrically connected to the redistribution pattern 830. For example, the package connection pad 420 may be electrically connected to the redistribution line pattern 833 via the redistribution via pattern 835.

The package connection terminal 430 may attached to the package connection pad 420. In addition, the package connection terminal 430 may be electrically connected to the third semiconductor structure ST3 via the package connection pad 420, the redistribution pattern 830, the lower penetration electrode 105, and the chip connection pad 160.

In an example embodiment, a side surface of the redistribution structure 800 may be on the same plane as a side surface of the first bonding semiconductor chip 100 of the third semiconductor structure ST3. In addition, a length of the redistribution structure 800 in the horizontal direction may be substantially the same as the length of the first bonding semiconductor chip 100 in the horizontal direction.

Because the semiconductor package 50 according to an example embodiment includes the redistribution structure 800, the semiconductor package 50 may be thin and light.

Hereinafter, detailed descriptions of a fabrication method of a semiconductor package according to example embodiments are given with reference to FIGS. 13 through 20. The fabrication method of a semiconductor package of the inventive concepts may include the fabrication method of the semiconductor package 15 described with reference to FIG. 4.

Figure 13:
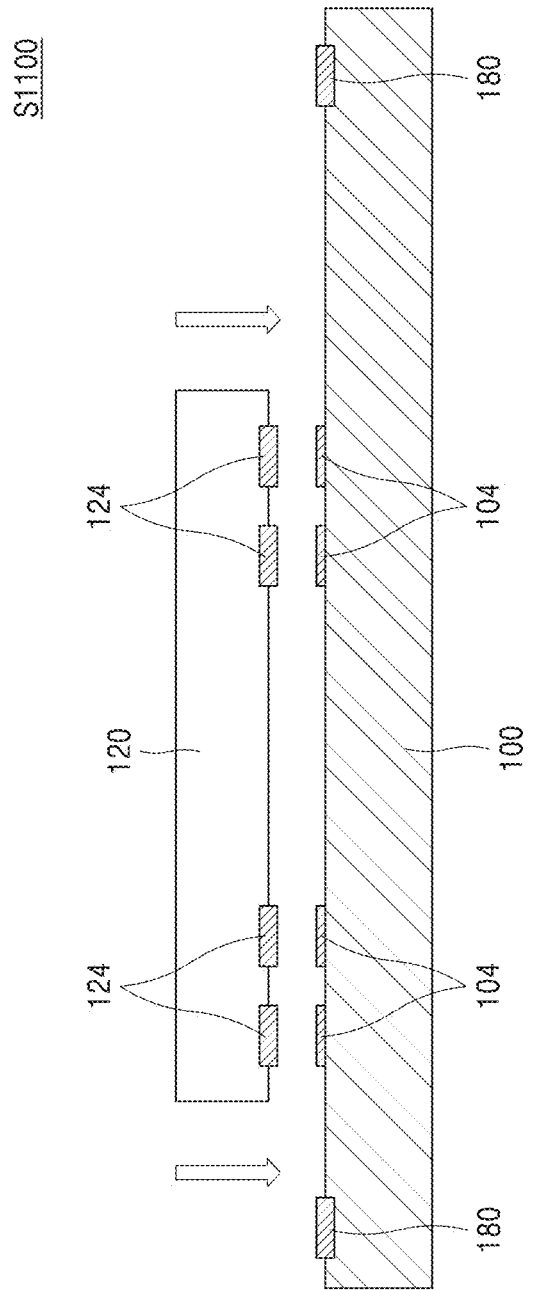
FIG. 13 is a diagram of an operation of forming a first semiconductor structure, according to an example embodiment.

FIG. 13 is a diagram of operation S1100 of forming the first semiconductor structure ST1, according to an example embodiment.

Referring to FIG. 13, the fabrication method of a semiconductor package according to an example embodiment may include operation S1100 of forming the first semiconductor structure ST1 by bonding the first bonding semiconductor chip 100 with the second bonding semiconductor chip 120.

The first semiconductor structure ST1 may be formed by using a die-to-wafer bonding process (S1100). In an example embodiment, the first bonding semiconductor chip 100 may be provided at the wafer level, and the second bonding semiconductor chip 120 may be provided at the die level.

In an example embodiment, the second bonding semiconductor chip 120 may be attached to the first bonding semiconductor chip 100 so that a first chip connection pad 104 of the first semiconductor chip 100 contacts a second chip connection pad 124 of the second bonding semiconductor chip 120.

The first chip connection pad 104 and the second chip connection pad 124 may be integrated, and form the chip connection pad (160 in FIG. 1) (S1100).

The first bonding semiconductor chip 100 used in operation S1100 may not include a memory cell. In addition, the first bonding semiconductor chip 100 may include a logic buffer chip including a serial-parallel conversion circuit, a test logic circuit such as DFT, JTAG, and MBIST, and a signal interface circuit such as PHY.

In addition, the first bonding semiconductor chip 100 may include the ECC circuit therein. In an example embodiment, the first bonding semiconductor chip 100 may perform ECC encoding and decoding processes on data, and accordingly, may be configured to detect and correct an error of the data.

In addition, the first bonding semiconductor chip 100 may include the FBI circuit therein. In an example embodiment, the first bonding semiconductor chip 100 may be configured to amplify a frequency of a data signal.

In addition, the first bonding semiconductor chip 100 used in operation S1200 may include a memory semiconductor chip including a memory cell.

Figure 14:
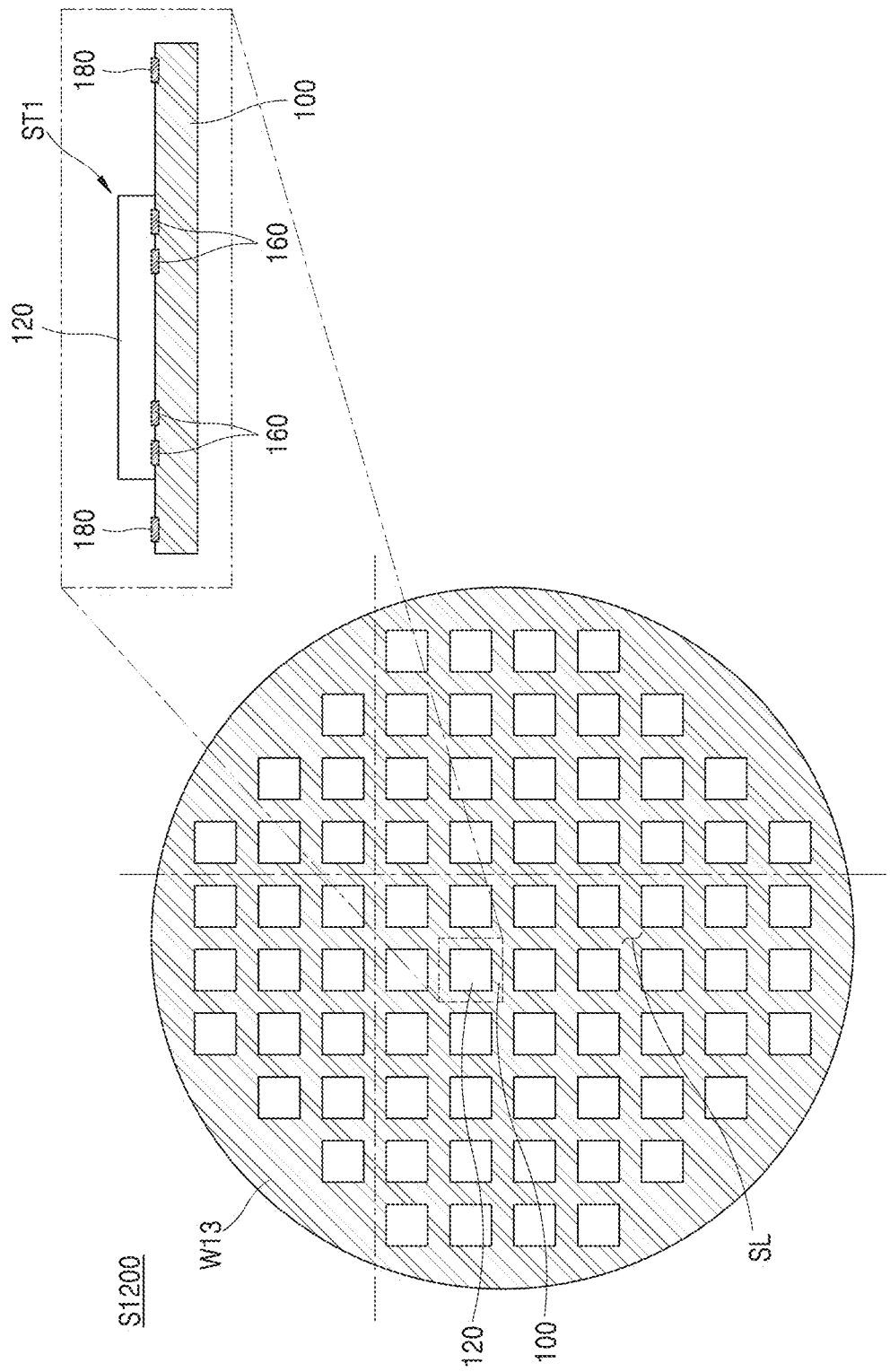
FIG. 14 is a diagram of an operation of individualizing a first semiconductor structure, according to an example embodiment.

FIG. 14 is a diagram of operation S1200 of individualizing the first semiconductor structure ST1, according to an example embodiment.

Referring to FIG. 14, operation S1200 may include an operation of forming the plurality of the first semiconductor structures ST1 by individualizing a work result W13 of FIG. 13, which is provided at the wafer level.

In an example embodiment, scribe lanes SL formed on the work result W13 of FIG. 13 may be cut (S1100). In an example embodiment, the scribe lanes SL of the work result W13 of FIG. 13 may be physically removed by using a dicing blade (not illustrated). Accordingly, the plurality of first semiconductor structures ST1 may be formed.

Figure 15:
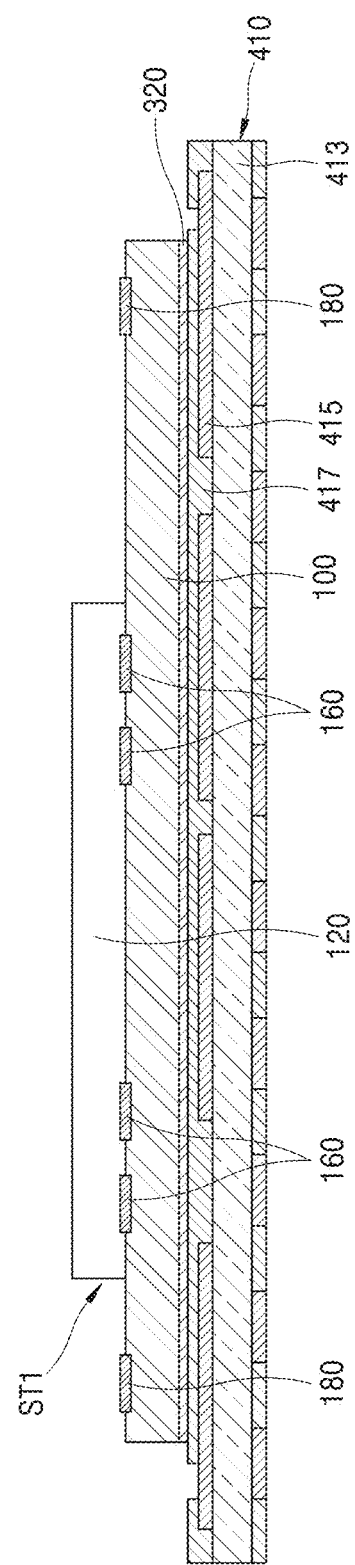
FIG. 15 is a diagram of an operation of attaching a first semiconductor structure to a package substrate, according to an example embodiment.

FIG. 15 is a diagram of operation S1300 of attaching the first semiconductor structure ST1 to the package substrate 410, according to an example embodiment.

Referring to FIG. 15, the fabrication method of a semiconductor package according to an example embodiment may include operation S1300 of attaching the first semiconductor structure ST1 to the package substrate 410.

The first semiconductor structure ST1 may be attached to a surface of the package substrate 410 by using the adhesion layer 320 (S1300). In an example embodiment, while the adhesion layer 320 is attached to a lower surface of the first semiconductor structure ST1, the first semiconductor structure ST1 may be moved downwardly, and fixed to the package substrate 410.

Figure 16:
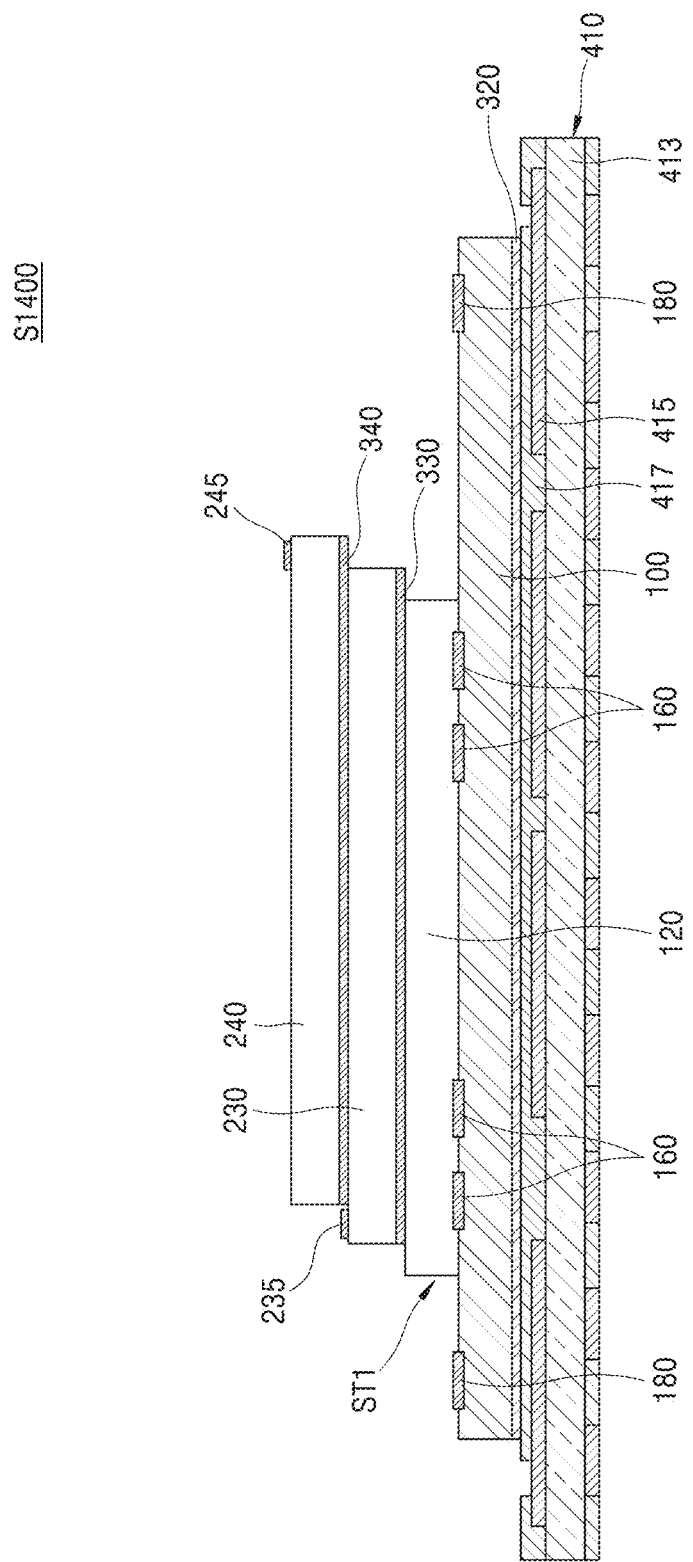
FIG. 16 is a diagram of an operation of mounting first and second stacked semiconductor chips on a first semiconductor structure, according to an example embodiment.

FIG. 16 is a diagram of operation S1400 of mounting the first and second stacked semiconductor chips 230 and 240 on the first semiconductor structure ST1, according to an example embodiment.

Referring to FIG. 16, the fabrication method of a semiconductor package according to an example embodiment may include operation S1400 of mounting the first and second stacked semiconductor chips 230 and 240 on the first semiconductor structure ST1.

The first and second stacked semiconductor chips 230 and 240 may be mounted on the first semiconductor structure ST1 (S1400). In an example embodiment, the first stacked semiconductor chip 230 may be attached to an upper surface of the second bonding semiconductor chip 120 by using the adhesion layer 330. In addition, the second stacked semiconductor chip 240 may be attached to the upper surface of the second semiconductor chips 120 by using the adhesion layer 340.

In an example embodiment, the second stacked semiconductor chip 240 may be attached to an upper surface of the first stacked semiconductor chip 230 so that the first chip pad 235 of the first stacked semiconductor chip 230 is exposed.

Figure 17:
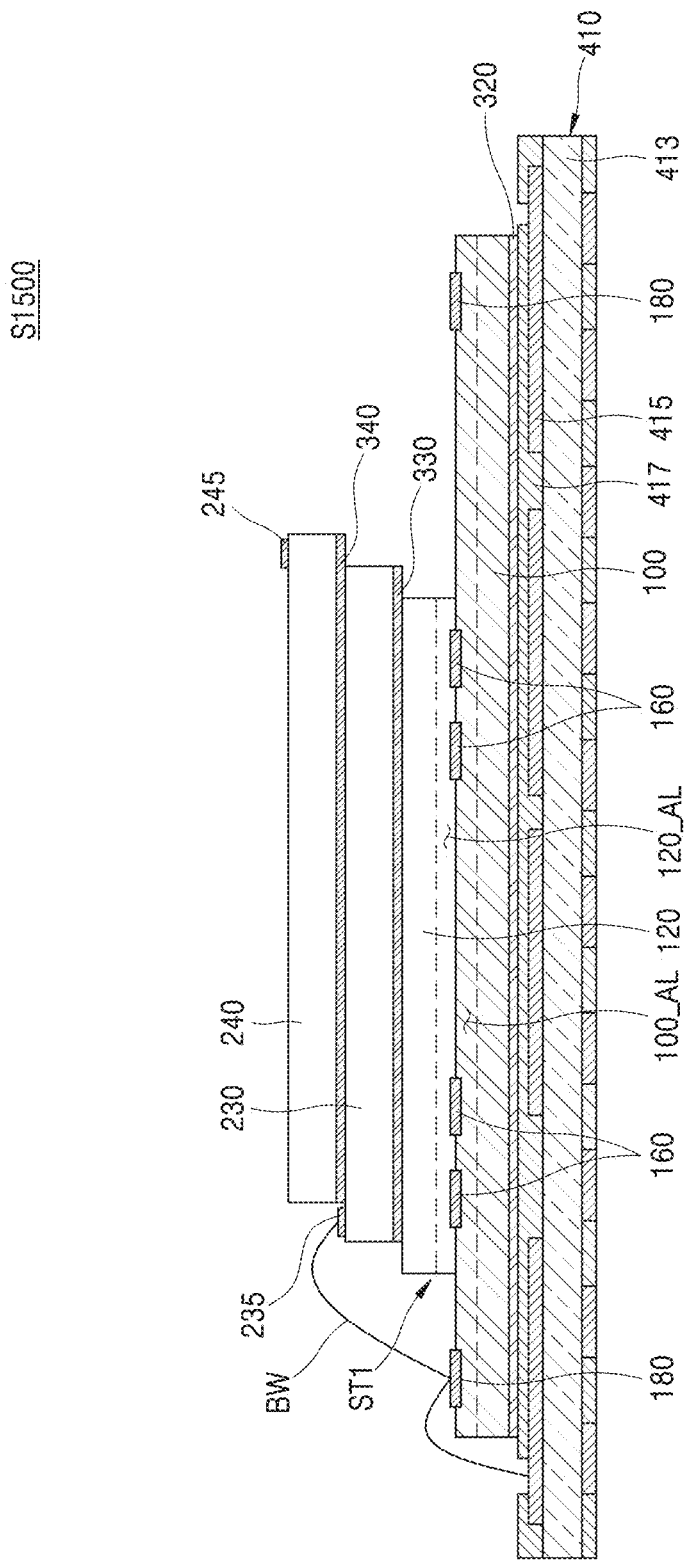
FIG. 17 is a diagram of an operation of forming a bonding wire, according to an example embodiment.

FIG. 17 is a diagram of operation S1500 of forming the bonding wire BW, according to an example embodiment.

Referring to FIG. 17, the fabrication method of a semiconductor package according to an example embodiment may include operation S1400 of forming the bonding wire BW.

The bonding wire BW may electrically connect the wire bonding pad 180 of the first semiconductor structure ST1 to the wiring pattern 415 of the package substrate 410 (S1400). In addition, the bonding wire BW may electrically connect the wire bonding pad 180 of the first semiconductor structure ST1 to the first chip pad 235 of the first stacked semiconductor chip 230.

Figure 18:
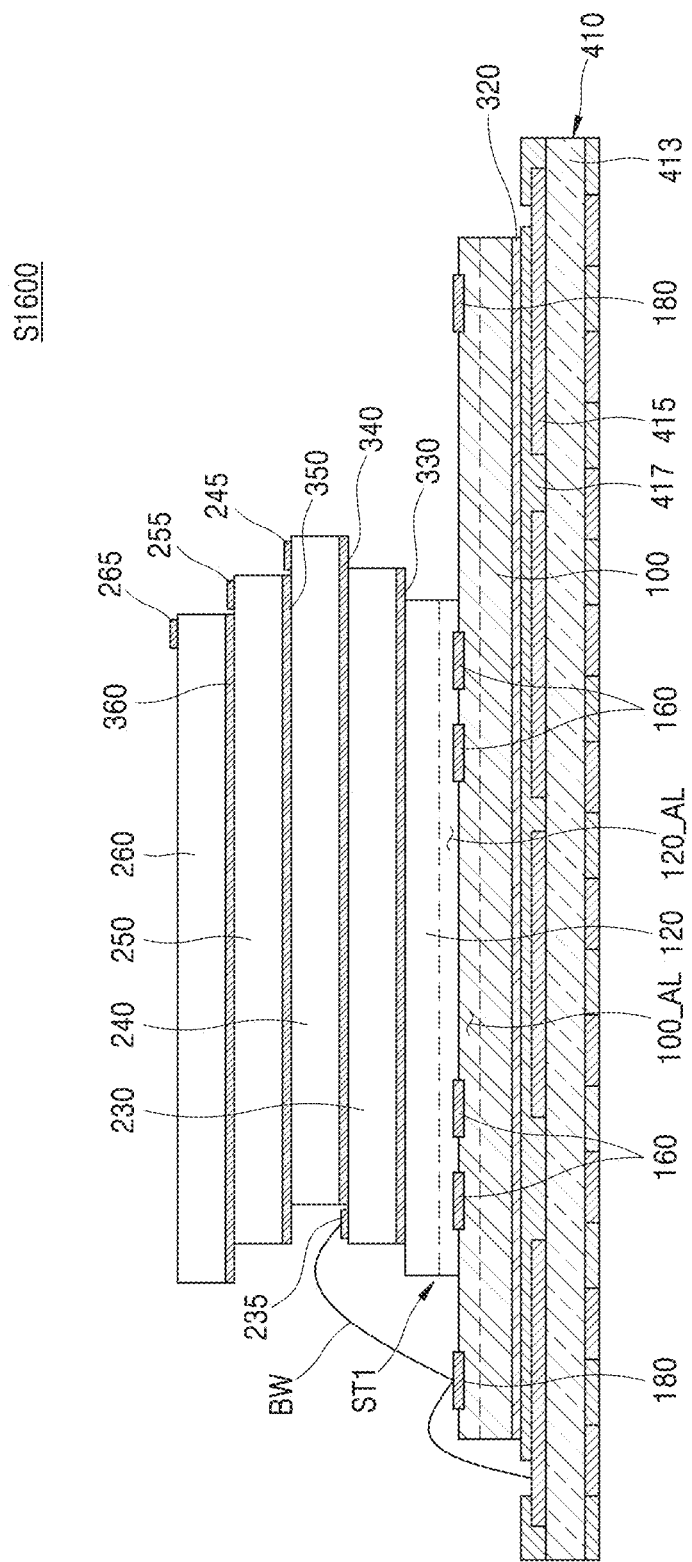
FIG. 18 is a diagram of an operation of mounting third and fourth stacked semiconductor chips on a second stacked semiconductor chip, according to an example embodiment.

FIG. 18 is a diagram of operation S1600 of mounting the third and fourth stacked semiconductor chips 250 and 260 on the second stacked semiconductor chip 240 according to an example embodiment.

Referring to FIG. 18, the fabrication method of a semiconductor package according to an example embodiment may include operation S1600 of mounting the third and fourth stacked semiconductor chips 250 and 260 on the second stacked semiconductor chip 240.

The third stacked semiconductor chip 250 may be mounted on the second stacked semiconductor chip 240, and the fourth stacked semiconductor chip 260 may be mounted on the third stacked semiconductor chip 250 (S1600).

In an example embodiment, the third stacked semiconductor chip 250 may be attached to an upper surface of the second stacked semiconductor chip 240 by using the adhesion layer 350, and the fourth stacked semiconductor chip 260 may be attached to an upper surface of the third stacked semiconductor chip 250 by using the adhesion layer 360.

In an example embodiment, the third stacked semiconductor chip 250 may be attached to the upper surface of the second stacked semiconductor chip 240 so that the second chip pad 245 of the second stacked semiconductor chip 240 is exposed. In addition, the fourth stacked semiconductor chip 260 may be attached to the upper surface of the third stacked semiconductor chip 250 so that the third chip pad 255 of the third stacked semiconductor chip 250 is exposed.

Figure 19:
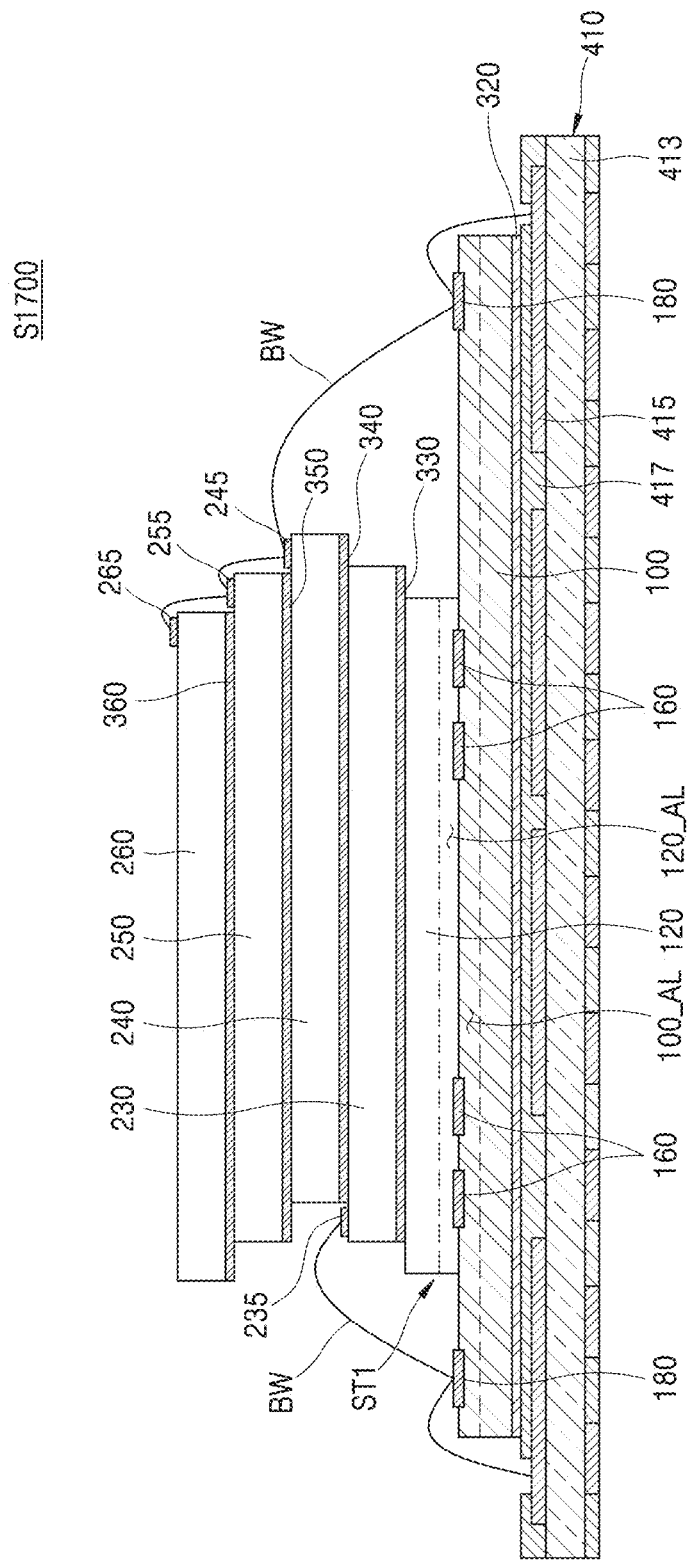
FIG. 19 is a diagram of an operation of forming a bonding wire, according to an example embodiment.

FIG. 19 is a diagram of operation S1700 of forming the bonding wire BW, according to an example embodiment.

Referring to FIG. 19, the fabrication method of a semiconductor package according to an example embodiment may include operation S1700 of forming the bonding wire BW.

The bonding wire BW may electrically connect the wire bonding pad 180 of the first semiconductor structure ST1 to the second chip pad 245 of the second stacked semiconductor chip 240 (S1700). In addition, the bonding wire BW may electrically connect the wire bonding pad 180 of the first semiconductor structure ST1 to the wiring pattern 415 of the package substrate 410.

In addition, the bonding wire BW may electrically interconnect the second chip pad 245 of the second stacked semiconductor chip 240, the third chip pad 255 of the third stacked semiconductor chip 250, and the fourth chip pad 265 of the fourth stacked semiconductor chip 260 to each other.

Figure 20:
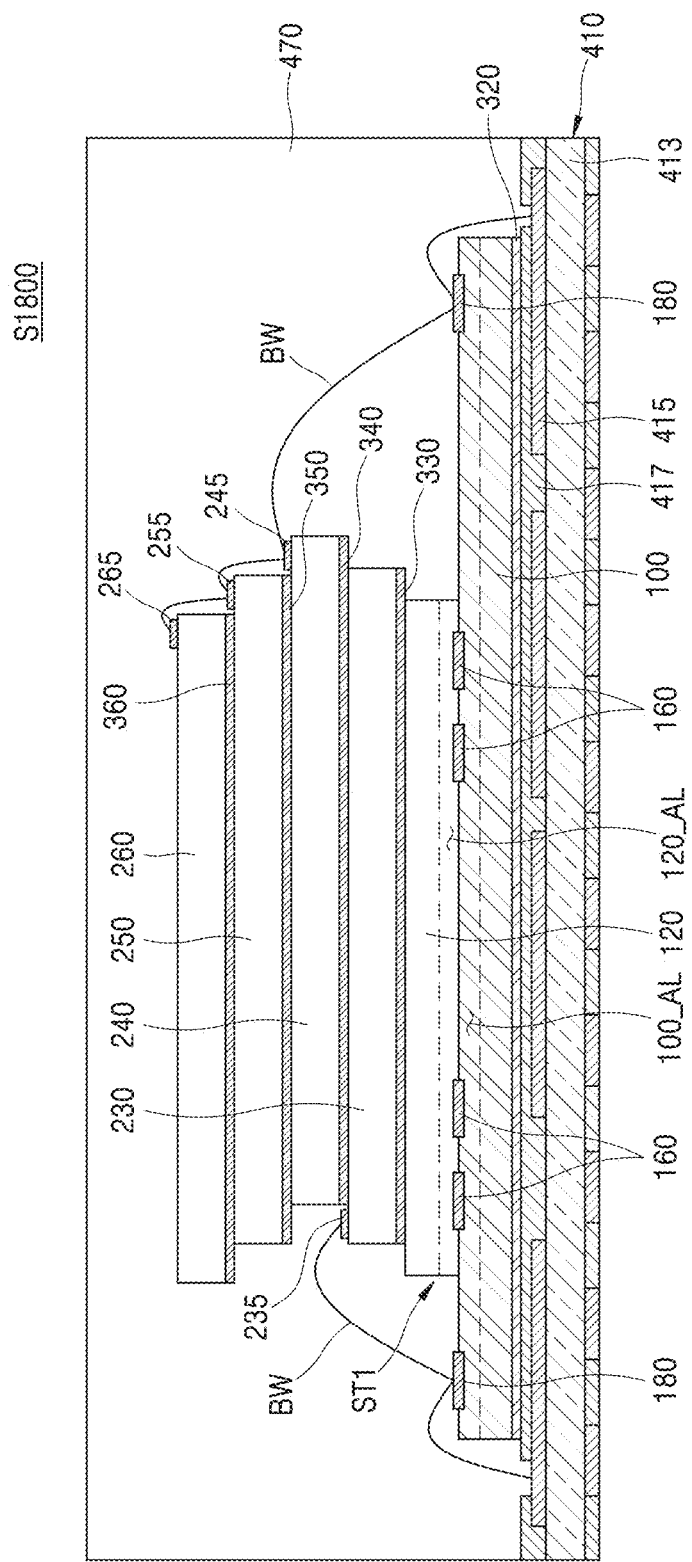
FIG. 20 is a diagram of an operation of forming a molding layer on a package substrate, according to an example embodiment.

FIG. 20 is a diagram of operation S1800 of forming the molding layer 470 on the package substrate 410, according to an example embodiment.

Referring to FIG. 20, the fabrication method of a semiconductor package according to an example embodiment may include operation S1800 of forming the molding layer 470.

The molding layer 470 may be formed on the package substrate 410, and surround the first semiconductor structure ST1, and the first through fourth stacked semiconductor chips 230, 240, 250, and 260 (S1800). For example, the molding layer 470 may include EMC.

In addition, additionally, the fabrication method of a semiconductor package according to an example embodiment may further include an operation of attaching the package connection terminal 430 to the package substrate 410. In an example embodiment, the package connection terminal 430 may be electrically connected to the wiring pattern 415 of the package substrate 410.

While the inventive concepts have been particularly shown and described with reference to embodiments thereof, it will be understood that various changes in form and details may be made therein without departing from the spirit and scope of the following claims.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

What is claimed is:

1. A semiconductor package comprising:
   a semiconductor structure including:
   a first bonding semiconductor chip having a first active layer in an upper portion thereof;
   a second bonding semiconductor chip on the first bonding semiconductor chip, the second bonding semiconductor chip having a second active layer in a lower portion thereof to face the first active layer and having a cross-section area in a horizontal direction less than a cross-section area of the first bonding semiconductor chip in the horizontal direction;
   a chip connection pad between the first bonding semiconductor chip and the second bonding semiconductor chip; and
   a wire bonding pad on the first bonding semiconductor chip to be outside the second bonding semiconductor chip;
   a first stacked semiconductor chip on the semiconductor structure and including a first chip pad on an upper surface thereof;
   a second stacked semiconductor chip on the first stacked semiconductor chip to expose the first chip pad and the second stacked semiconductor chip including a second chip pad on an upper surface thereof; and
   a bonding wire configured to connect at least one of the wire bonding pad to the first chip pad, the wire bonding pad to the second chip pad, or the first chip pad to the second chip pad.

2. The semiconductor package of claim 1, wherein the first bonding semiconductor chip of the semiconductor structure comprises:
   a buffer region configured to store data of at least any one of the second bonding semiconductor chip, the first stacked semiconductor chip, and the second stacked semiconductor chip;
   a logic region including an error correction code (ECC) circuit configured to detect and correct a data error of at least any one of the second bonding semiconductor chip, the first stacked semiconductor chip, and the second stacked semiconductor chip; and
   an input/output region including a frequency boosting interface (FBI) circuit configured to amplify a frequency of a data signal of at least one of the second bonding semiconductor chip, the first stacked semiconductor chip, and the second stacked semiconductor chip, wherein the wire bonding pad is mounted on the input/output region.

3. The semiconductor package of claim 2, wherein the buffer region is formed in a portion of the first bonding semiconductor chip that overlaps the second bonding semiconductor chip in a vertical direction,
   wherein the logic region is on a side portion of the buffer region not to overlap the second bonding semiconductor chip in the vertical direction, and
   wherein the input/output region is on a periphery portion of the first bonding semiconductor chip.

4. The semiconductor package of claim 1, wherein the first bonding semiconductor chip of the semiconductor structure comprises:
   a buffer region configured to store data of at least any one of the second bonding semiconductor chip, the first stacked semiconductor chip, and the second stacked semiconductor chip; and
   a logic region including an error correction code (ECC) circuit configured to detect and correct a data error of at least any one of the second bonding semiconductor chip, the first stacked semiconductor chip, and the second stacked semiconductor chip.

5. The semiconductor package of claim 1, wherein the first bonding semiconductor chip of the semiconductor structure comprises:
   a buffer region configured to store data of at least any one of the second bonding semiconductor chip, the first stacked semiconductor chip, and the second stacked semiconductor chip; and
   an input/output region including a frequency boosting interface (FBI) circuit configured to amplify a frequency of a data signal of at least one of the second bonding semiconductor chip, the first stacked semiconductor chip, and the second stacked semiconductor chip, wherein the wire bonding pad is on the input/output region.

6. The semiconductor package of claim 1, further comprising:
   a package substrate supporting the semiconductor structure; and
   a molding layer on the package substrate, and surrounding each of the semiconductor structure, the first stacked semiconductor chip, and the second stacked semiconductor chip.

7. The semiconductor package of claim 6, further comprising an adhesion layer between the package substrate and the semiconductor structure, between the semiconductor structure and the first stacked semiconductor chip, and between the first stacked semiconductor chip and the second stacked semiconductor chip.

8. The semiconductor package of claim 1, wherein, when the semiconductor structure is seen in a plan view, the second bonding semiconductor chip is on the first bonding semiconductor chip so that a center of the second bonding semiconductor chip is apart from a center of the first bonding semiconductor chip at a certain distance.

9. A semiconductor package comprising:
   a semiconductor structure including:
   a first bonding semiconductor chip having a first active layer in an upper portion thereof;
   a second bonding semiconductor chip on the first bonding semiconductor chip, the second bonding semiconductor chip having a second active layer in a lower portion thereof to face the first active layer and having a cross-section area in a horizontal direction identical to a cross-section area of the first bonding semiconductor chip in the horizontal direction;

a plurality of chip connection pads between the first bonding semiconductor chip and the second bonding semiconductor chip;

a wire bonding pad on the second bonding semiconductor chip; and an upper penetration electrode configured to penetrate at least a portion of the second bonding semiconductor chip in a vertical direction to connect at least any one of the plurality of chip connection pads to the wire bonding pad;

a first stacked semiconductor chip on the semiconductor structure and having a first chip pad on an upper surface thereof;

a second stacked semiconductor chip on the first stacked semiconductor chip to expose the first chip pad and having a second chip pad on an upper surface thereof; and a bonding wire configured to connect at least one of the wire bonding pad to the first chip pad, the wire bonding pad to the second chip pad, or the first chip pad to the second chip pad.

10. The semiconductor package of claim 9, wherein a side surface of the first bonding semiconductor chip and a side surface of the second bonding semiconductor chip are on a same plane.

11. The semiconductor package of claim 9, wherein the first bonding semiconductor chip of the semiconductor structure comprises:

a buffer region configured to store data of at least any one of the second bonding semiconductor chip, the first stacked semiconductor chip, and the second stacked semiconductor chip;

a logic region including an error correction code (ECC) circuit configured to detect and correct a data error of at least any one of the second bonding semiconductor chip, the first stacked semiconductor chip, and the second stacked semiconductor chip; and an input/output region including a frequency boosting interface (FBI) circuit configured to amplify a frequency of a data signal of at least one of the second bonding semiconductor chip, the first stacked semiconductor chip, and the second stacked semiconductor chip, wherein the wire bonding pad is on the input/output region.

12. The semiconductor package of claim 9, wherein the first bonding semiconductor chip of the semiconductor structure comprises:

a buffer region configured to store data of at least any one of the second bonding semiconductor chip, the first stacked semiconductor chip, and the second stacked semiconductor chip; and a logic region including an error correction code (ECC) circuit configured to detect and correct a data error of at least any one of the second bonding semiconductor chip, the first stacked semiconductor chip, and the second stacked semiconductor chip.

13. The semiconductor package of claim 9, wherein the first bonding semiconductor chip of the semiconductor structure comprises:

a buffer region configured to store data of at least any one of the second bonding semiconductor chip, the first stacked semiconductor chip, and the second stacked semiconductor chip; and an input/output region including a frequency boosting interface (FBI) circuit configured to amplify a frequency of a data signal of at least one of the second bonding semiconductor chip, the first stacked semiconductor chip, and the second stacked semiconductor chip.

14. The semiconductor package of claim 9, further comprising:

a package substrate that supports the semiconductor structure; and a molding layer on the package substrate, and surrounding each of the semiconductor structure, the first stacked semiconductor chip, and the second stacked semiconductor chip.

15. The semiconductor package of claim 14, further comprising an adhesion layer between the package substrate and the semiconductor structure, between the semiconductor structure and the first stacked semiconductor chip, and between the first stacked semiconductor chip and the second stacked semiconductor chip.

16. A semiconductor package comprising:

a semiconductor structure including:

a first bonding semiconductor chip having a first active layer in an upper portion thereof;

a second bonding semiconductor chip on the first bonding semiconductor chip, the second bonding semiconductor chip having a second active layer in a lower portion thereof to face the first active layer and having a cross-section area in a horizontal direction less than a cross-section area of the first bonding semiconductor chip in the horizontal direction;

a chip connection pad between the first bonding semiconductor chip and the second bonding semiconductor chip;

a wire bonding pad on the first bonding semiconductor chip to be outside of the second bonding semiconductor chip; and a lower penetration electrode configured to penetrate at least a portion of the first bonding semiconductor chip in a vertical direction and connected to the chip connection pad;

a redistribution structure under the semiconductor structure, the redistribution structure including: a redistribution insulation layer that supports the semiconductor structure; and a redistribution pattern that extends in the redistribution insulation layer and connected to the lower penetration electrode;

a first stacked semiconductor chip on the semiconductor structure and having a first chip pad on an upper surface thereof;

a second stacked semiconductor chip on the first stacked semiconductor chip to expose the first chip pad and having a second chip pad on an upper surface thereof; and a bonding wire configured to connect at least one of the wire bonding pad to the first chip pad, the wire bonding pad to the second chip pad, or the first chip pad to the second chip pad.

17. The semiconductor package of claim 16, further comprising a molding layer on the redistribution structure, and that surrounds each of the semiconductor structure, the first stacked semiconductor chip, and the second stacked semiconductor chip.

18. The semiconductor package of claim 16, wherein the first bonding semiconductor chip of the semiconductor structure comprises:

a buffer region configured to store data of at least any one of the second bonding semiconductor chip, the first stacked semiconductor chip, and the second stacked semiconductor chip;

a logic region including an error correction code (ECC) circuit configured to detect and correct a data error of at least any one of the second bonding semiconductor chip, the first stacked semiconductor chip, and the second stacked semiconductor chip; and an input/output region including a frequency boosting interface (FBI) circuit configured to amplify a frequency of a data signal of at least one of the second bonding semiconductor chip, the first stacked semiconductor chip, and the second stacked semiconductor chip, the input/output region having the wire bonding pad thereon.

19. The semiconductor package of claim 18, wherein the buffer region is formed in a portion of the first bonding semiconductor chip that overlaps the second bonding semiconductor chip in a vertical direction, wherein the logic region is on a side portion of the buffer region not to overlap the second bonding semiconductor chip in the vertical direction, and wherein the input/output region is on a periphery portion of the first bonding semiconductor chip.

20. The semiconductor package of claim 16, further comprising an adhesion layer between the redistribution structure and the semiconductor structure, between the semiconductor structure and the first stacked semiconductor chip, and between the first stacked semiconductor chip and the second stacked semiconductor chip.

* * * * *